(12) United States Patent
Kim et al.

(10) Patent No.: US 8,435,855 B2
(45) Date of Patent: May 7, 2013

(54) METHODS OF MANUFACTURING SEMICONDUCTOR DEVICES

(75) Inventors: Kang-Uk Kim, Seoul (KR); Yong-Chul Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 367 days.

(21) Appl. No.: 12/656,440

(22) Filed: Jan. 29, 2010

(65) Prior Publication Data

US 2010/0197121 A1 Aug. 5, 2010

(30) Foreign Application Priority Data

Feb. 2, 2009 (KR) .................. 10-2009-0007954

(51) Int. Cl.
*H01L 21/336* (2006.01)

(52) U.S. Cl.
USPC ........... 438/258; 438/260; 438/269; 257/326; 257/328; 257/135; 257/E21.619; 257/E21.634; 257/E21.676; 257/E23.13; 257/E29.131; 257/E29.267

(58) Field of Classification Search .......... 438/268, 438/269, 258; 257/326, 328, 135, E29.131, 257/E23.13, E29.267, E21.619, E21.634, 257/E21.676
See application file for complete search history.

(56) References Cited

U.S. PATENT DOCUMENTS

| | | | |
|---|---|---|---|
| 5,891,773 A | 4/1999 | Saitoh | |
| 6,660,590 B2 | 12/2003 | Yoo | |
| 7,476,933 B2 * | 1/2009 | Juengling | 257/331 |
| 2005/0098794 A1 * | 5/2005 | Quek et al. | 257/133 |
| 2006/0046391 A1 * | 3/2006 | Tang et al. | 438/268 |
| 2007/0228491 A1 * | 10/2007 | Forbes | 257/401 |
| 2007/0252196 A1 * | 11/2007 | Kim et al. | 257/329 |
| 2009/0121268 A1 * | 5/2009 | Lee et al. | 257/296 |
| 2010/0123202 A1 * | 5/2010 | Hofmann | 257/401 |

FOREIGN PATENT DOCUMENTS

| | | |
|---|---|---|
| JP | 08-250612 A | 9/1996 |
| KR | 10-0400325 B1 | 9/2003 |
| KR | 10-0486253 B1 | 4/2005 |

\* cited by examiner

*Primary Examiner* — Kimberly Rizkallah
*Assistant Examiner* — Maria Ligai
(74) *Attorney, Agent, or Firm* — Lee & Morse, P.C.

(57) ABSTRACT

A method of manufacturing a semiconductor device, the method including providing a substrate, the substrate including single crystalline silicon and having the first region and a second region; growing a pillar from a top surface of the substrate in the first region; forming a vertical channel transistor including a first gate structure such that first gate structure surrounds a central portion of the pillar; and forming a second transistor on the second region of the substrate such that the second transistor includes a second gate structure.

12 Claims, 35 Drawing Sheets

METHODS OF MANUFACTURING SEMICONDUCTOR DEVICES

BACKGROUND

1. Field

Embodiments relate to methods of manufacturing semiconductor devices.

2. Description of the Related Art

As semiconductor devices have become highly integrated, transistors having a reduced short channel effect and a low leakage current with a small area may be desired. Thus, transistors having a vertical channel have been studied. However, manufacturing the vertical channel transistors may be complicated and expensive, and process failures may occur during the manufacture thereof Additionally, manufacturing a vertical channel transistor and a planar transistor on the same substrate may not be easy.

SUMMARY

Embodiments are directed to methods of manufacturing semiconductor devices, which represent advances over the related art.

It is a feature of an embodiment to provide a method of manufacturing a semiconductor device having a vertical channel transistor, wherein the semiconductor device has a reduced process failure and good electrical characteristics.

It is another feature of an embodiment to provide a method of manufacturing a semiconductor device wherein a pillar having a desired size may be easily formed.

At least one of the above and other features and advantages may be realized by providing a method of manufacturing a semiconductor device, the method including providing a substrate, the substrate including single crystalline silicon and having a first region and a second region; growing a pillar from a top surface of the substrate in the first region thereof; forming a vertical channel transistor including a first gate structure such that first gate structure surrounds a central portion of the pillar; and forming a second transistor on the substrate in the second region thereof such that the second transistor includes a second gate structure.

The method may further include etching the substrate in the first region prior to growing the pillar such that a top surface of the substrate in the first region is lower than a top surface of the substrate in the second region.

The pillar may have a top surface coplanar with or higher than a top surface of the substrate in the second region.

The method may further include forming isolation layer patterns in upper portions of the substrate in the first and second regions.

Forming the isolation layer patterns may occur prior to forming the pillar.

Growing the pillar may include performing a laser epitaxial growth (LEG) process or a selective epitaxial growth (SEG) process.

The SEG process may include forming an insulation layer pattern on the substrate in the first region thereof; partially removing portions of the insulation layer pattern so as to form an opening exposing a top surface of the substrate in the first region; and growing the pillar from the top surface of the substrate.

The LEG process may include forming an insulation layer pattern on the substrate in the first region thereof; partially removing portions of the insulation layer pattern to form an opening exposing a top surface of the substrate in the first region; forming an amorphous silicon layer in the opening; and performing a heat treatment on the amorphous silicon layer to convert the amorphous silicon layer into the pillar including single crystalline silicon.

The method may further include forming a bit line by implanting impurities into an upper portion of the substrate.

Forming the bit line may occur prior to growing the pillar.

The method may further include forming a capacitor such that the capacitor is electrically connected to the pillar.

The method may further include forming an impurity region by implanting impurities into an upper portion of the pillar.

The second transistor may include a planar transistor.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
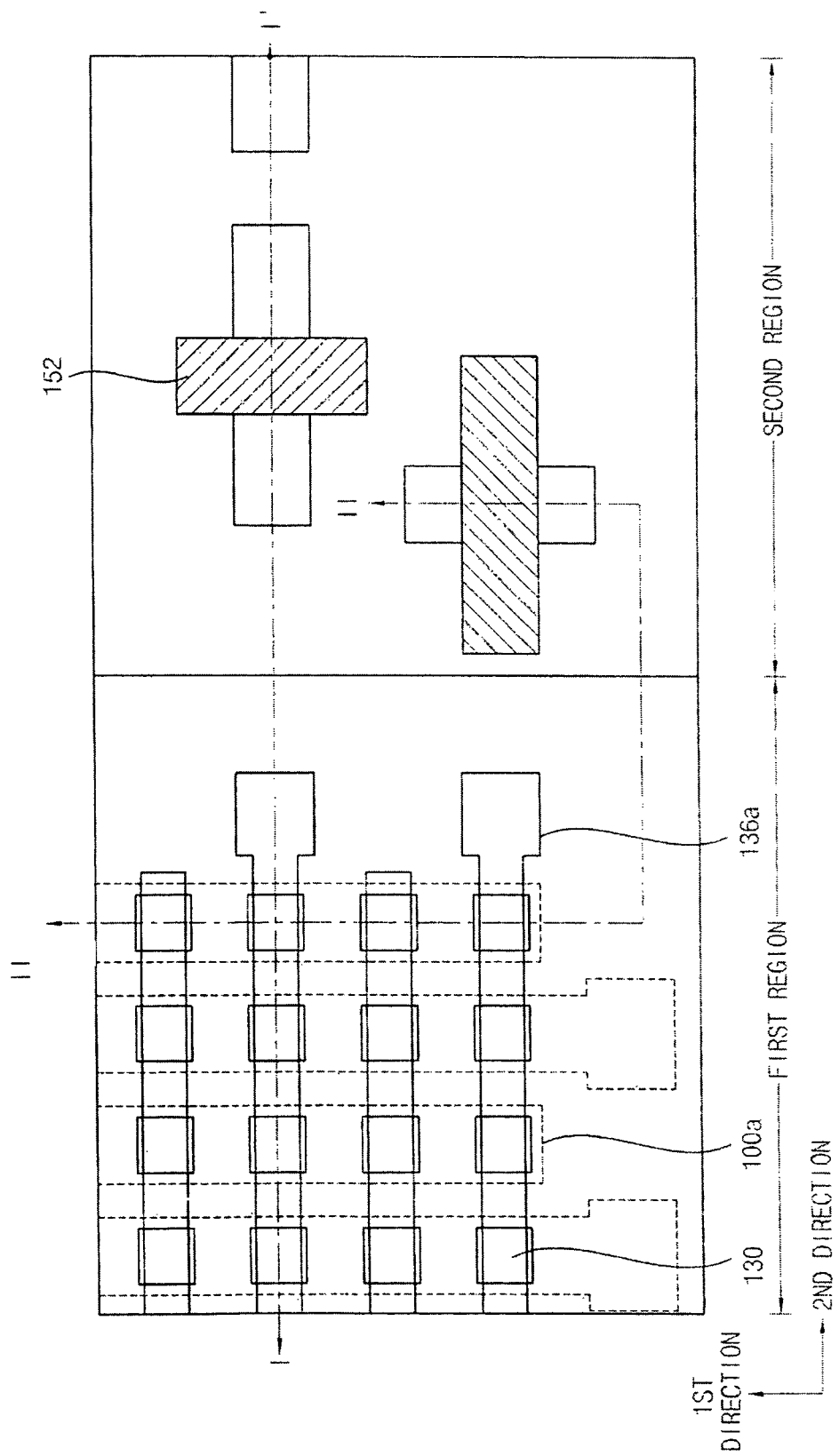
FIG. 1 illustrates a top view of a semiconductor device according to an embodiment.

Korean Patent Application No. 10-2009-0007954, filed on Feb. 2, 2009, in the Korean Intellectual Property Office, and entitled: "Methods of Manufacturing Semiconductor Devices," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" another element or layer, it can be directly connected to the other element or layer or intervening elements or layers may be present, unless otherwise explicitly stated. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "lower," "above," "upper," "higher," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "above" other elements or features would then be oriented "below" the other elements or features. Thus, the exemplary term "above" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 2:
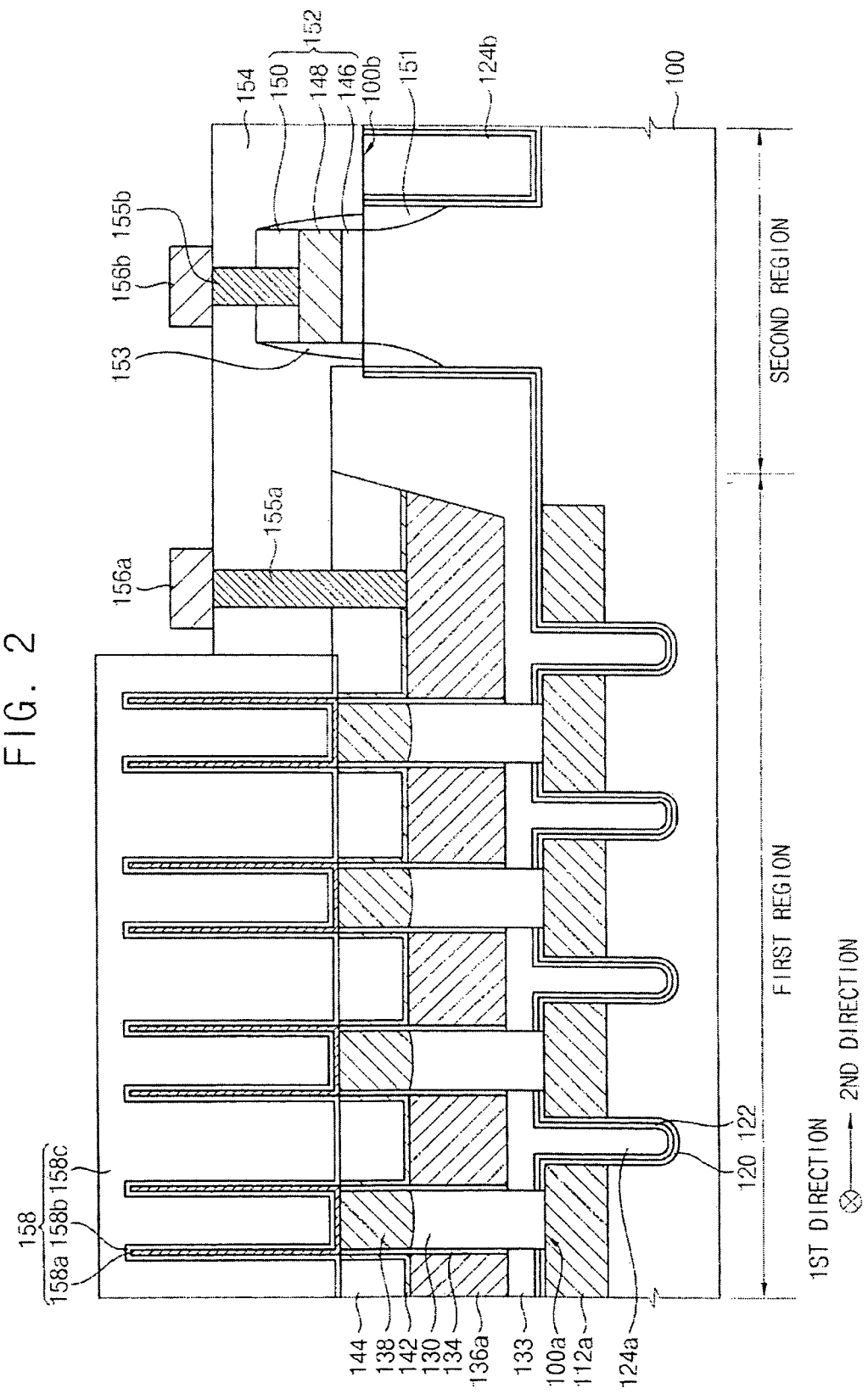
FIG. 2 illustrates a cross-sectional view of the semiconductor device in FIG. 1 taken along the line I-I'.
Figure 3:
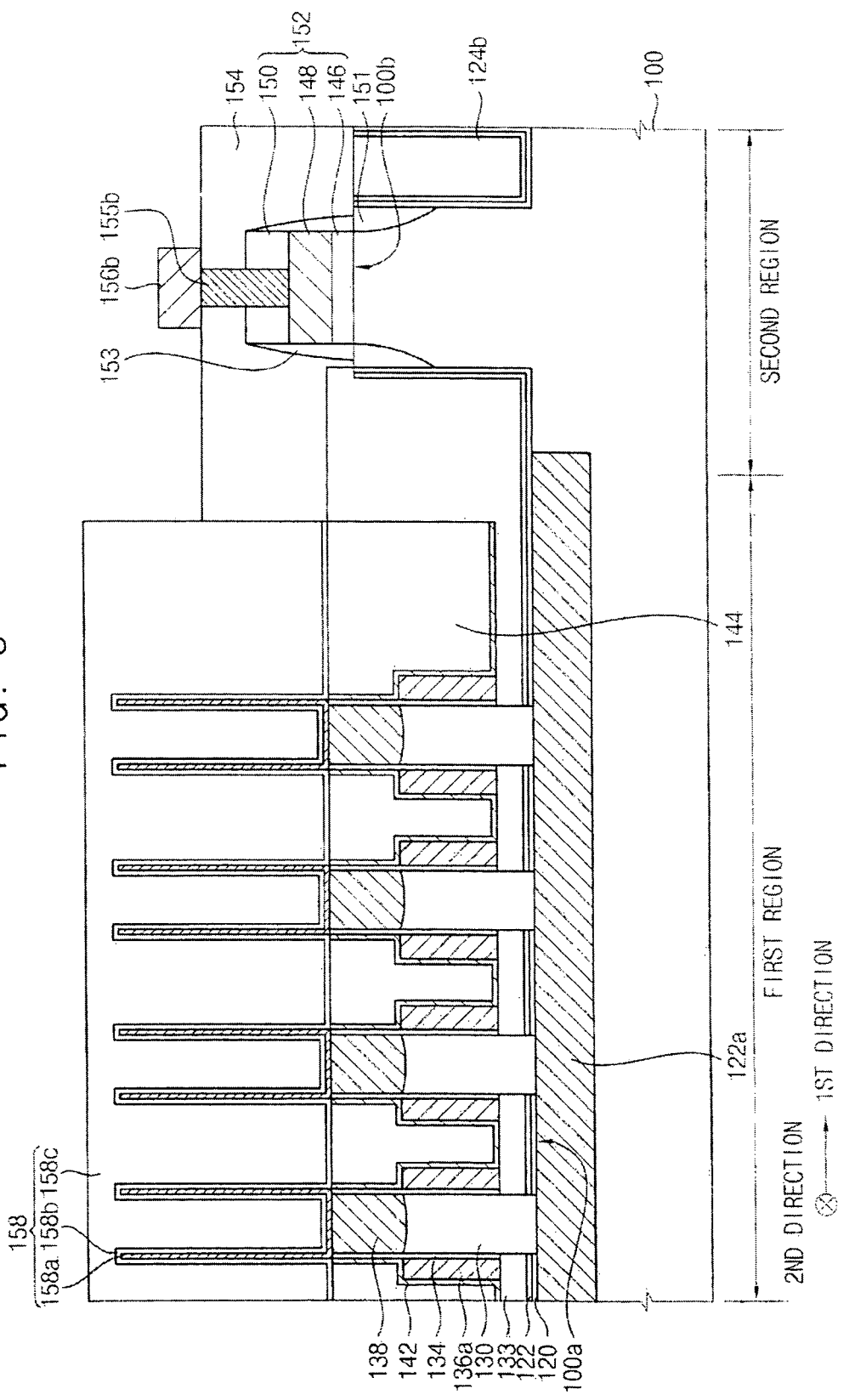
FIG. 3 illustrates a cross-sectional view of the semiconductor device in FIG. 1 taken along the line II-II'.

FIG. 1 illustrates a top view of a semiconductor device according to an embodiment. FIG. 2 illustrates a cross-sectional view of the semiconductor device in FIG. 1 taken along the line I-I'. FIG. 3 illustrates a cross-sectional view of the semiconductor device in FIG. 1 taken along the line II-II'.

Referring to FIGS. 1 to 3, the semiconductor device may include a substrate 100 having a first region and a second region. The substrate 100 may include, e.g., single crystalline silicon. In an alternative implementation, the substrate 100 may include, e.g., both single crystalline silicon and single crystalline germanium. The first region may serve as a cell region for memory cells and the second region may serve as a peripheral circuit region for peripheral circuits.

A first top surface 100a of the substrate 100 in the first region may be lower than a second top surface 100b of the substrate 100 in the second region.

A first isolation layer pattern 124a and a second isolation layer pattern 124b may be formed on the substrate 100 in the first and second regions, respectively. Thus, the substrate 100 may include a plurality of first active regions divided by the first isolation layer pattern 124a in the first region. In addition, the substrate 100 may include a plurality of second active regions divided by the second isolation layer pattern 124b in the second region. The first isolation layer pattern 124a may have a bottom lower than a bottom of the second isolation layer pattern 124b.

Each first active region may extend in a first direction. A first impurity region may be formed at an upper portion of each first active region of the substrate 100. The first impurity region may serve as a bit line 112a electrically connecting a plurality of pillars 130 aligned in the first direction.

The pillars 130 may be formed on the first active regions of the substrate 100. In particular, the pillars 130 may be formed on each first active region of the substrate 100 extending in the first direction. The pillars 130 may have a width narrower than a width of each first active region.

A top surface of the pillars 130 may be equal to, i.e., coplanar with, or higher than the second top surface 100b of the substrate 100 in the second region.

An oxide layer 120 and/or a first liner 122 may be formed on the substrate 100.

An insulation layer pattern 133 may be formed on the first liner 122 in the first region so as to surround lower portions of the pillars 130.

A first gate insulation layer 134 may be formed on sidewalls of the pillars 130. A first gate electrode 136a may be formed on the insulation layer pattern 133 to cover a portion of the first gate insulation layer 134. In particular, the first gate electrode 136a may surround portions of the first gate insulation layer 134 on central portions of the pillars 130. The first gate electrode 136a together with the first gate insulation layer 134 may be defined as a first gate structure. The first gate electrode 136*a* may extend in a second direction perpendicular to the first direction. The first gate electrode 136*a* may serve as a word line.

A second impurity region 138 may be formed at an upper portion of each pillar 130 to serve as a first source/drain region.

The first gate electrode 136*a*, the first gate insulation layer 134, and the second impurity region 138 may form a vertical channel transistor in the first region of the substrate 100.

A second liner 142 may be formed on the first gate electrode 136*a*, the first gate insulation layer 134, and the insulation layer pattern 133. A first insulating interlayer 144 may be formed on the second liner 142 to fill spaces between the first gate electrodes 136*a* and between the pillars 130.

A planar transistor may be formed on each second active region of the substrate 100. The planar transistor may include a second gate structure 152 and a second source/drain region 151. The second gate structure 152 may include a second gate insulation layer pattern 146, a second gate electrode 148, and a mask 150 sequentially stacked on the second active region of the substrate 100. The second source/drain region 151 may be formed at upper portions of the second active region adjacent to the second gate structure 152.

A second insulating interlayer 154 may be formed on the substrate 100, the second isolation layer pattern 124*b*, the insulation layer pattern 133, and the first insulating interlayer 144 to cover the second gate structure 152. A first contact plug 155*a* may be formed through the first and second insulating interlayers 144 and 154. A first wiring 156*a* may be formed on the second insulating interlayer 154 so as to be electrically connected to the first contact plug 155*a*. A second contact plug 155*b* may be formed through the second insulating interlayer 144 and the mask 150. A second wiring 156*b* may be formed on the second insulating interlayer 154 so as to be electrically connected to the second contact plug 155*b*. Other wirings (not shown) may be further formed on the second insulating interlayer 154 to be electrically connected to the second source/drain region 151.

Capacitors 158 may be formed so as to be electrically connected to respective pillars 130. Each capacitor 158 may include a lower electrode 158*a*, a dielectric layer 158*b*, and an upper electrode 158*c*. The lower electrode 158*a* may have, e.g., a cylindrical shape or a pillar shape.

As illustrated above, a plurality of memory cells, each including vertical channel transistors and capacitors, may be formed on the substrate 100 in the first region. Additionally, peripheral circuits having planar transistors may be formed on the substrate 100 in the second region.

Alternatively, the memory cell may not include the capacitors and may thus have a 1T structure.

FIGS. 4 to 17 illustrate cross-sectional views of stages in a method of manufacturing the semiconductor device of FIGS. 1 to 3 according to an embodiment.

Figure 4:
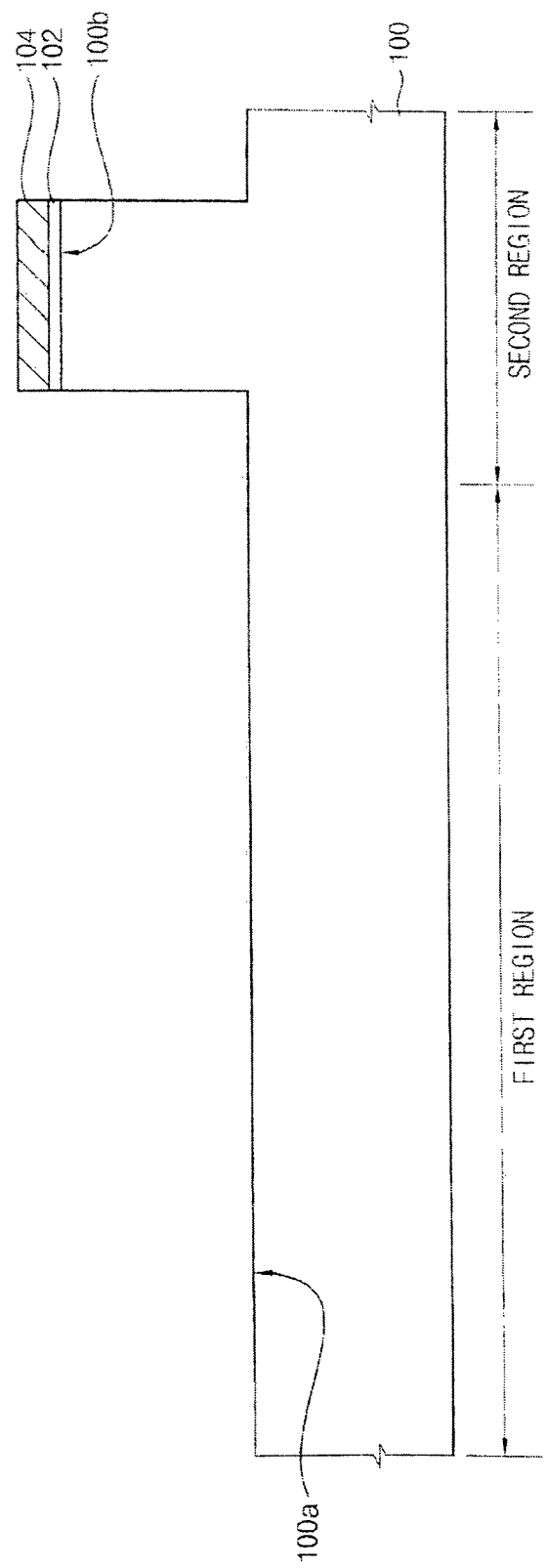
FIGS. 4 to 17 illustrate cross-sectional views of stages in a method of manufacturing the semiconductor device in FIGS. 1 to 3 according to an embodiment.

Referring to FIG. 4, a substrate 100 including a first region and a second region may be provided. The substrate 100 may include, e.g., single crystalline silicon. In an implementation, the substrate 100 may include, e.g., both single crystalline silicon and single crystalline germanium. The first region may serve as a cell region and the second region may serve as a peripheral region.

A pad oxide layer and a first hard mask layer may be formed on the substrate 100. The pad oxide layer may be formed by thermally oxidizing a top surface of the substrate 100. The first hard mask layer may be formed from, e.g., silicon nitride using a chemical vapor deposition (CVD) process.

The first hard mask and the pad oxide layer may be patterned using a first photoresist pattern (not illustrated) to form a first hard mask 104 and a pad oxide layer pattern 102. The first photoresist pattern may then be removed.

Portions of the first region the second region of the substrate 100 may be removed using the first hard mask 104 and the pad oxide layer pattern 102 as an etching mask. The portions of the first region and the second region may be removed by, e.g., an anisotropic etching process. In particular, a greater portion of the first region may be removed relative to the second region. Thus, the first region of the substrate 100 may have a first top surface 100*a* lower than a second top surface 100*b* of the substrate 100 in the second region.

The removed portion of the second region may provide a space for forming a second isolation layer pattern 124*b* (see FIG. 9), and thus a bottom of the second isolation layer pattern 124*b* may be substantially at the same level as, i.e., coplanar with, the first top surface 100*a* of the first region of the substrate 100.

Figure 5:
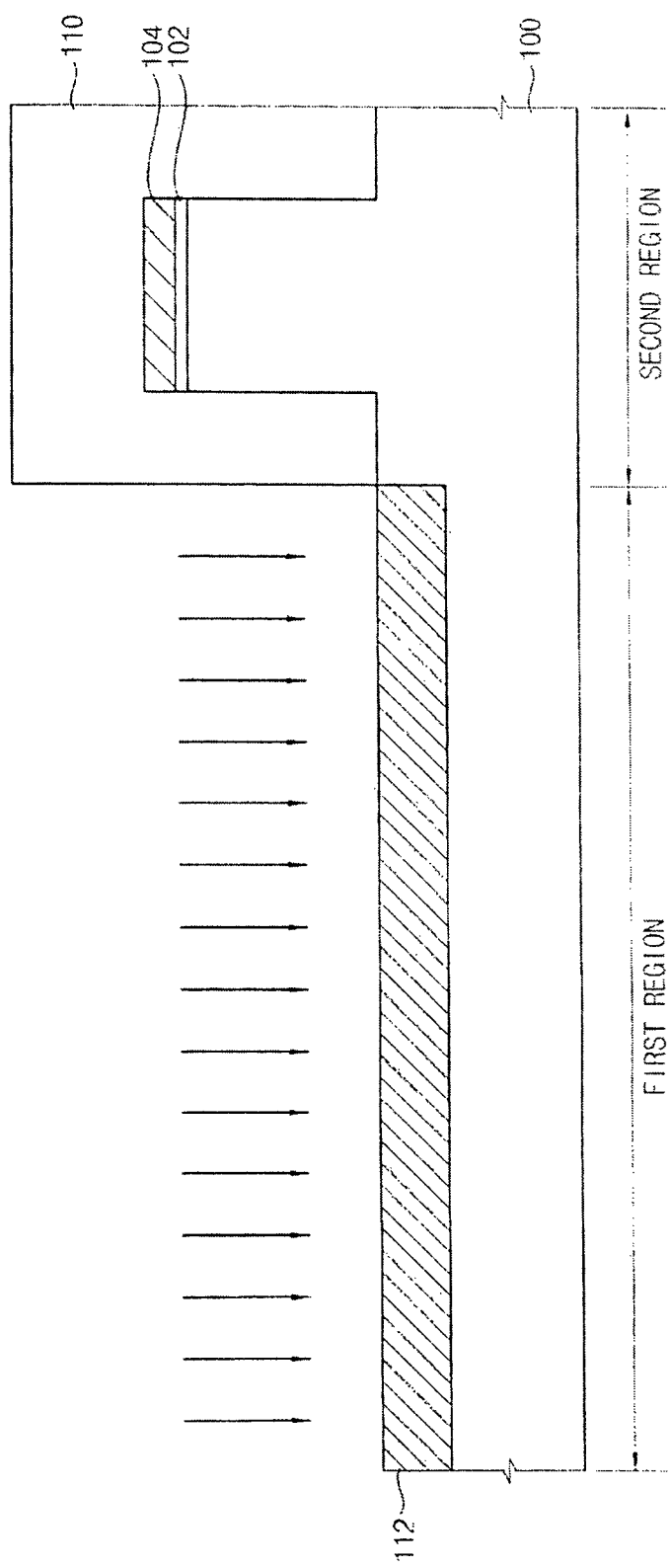

Referring to FIG. 5, a second photoresist pattern 110 may be formed on the substrate 100 so as to expose the first region thereof.

Impurities may be implanted into the exposed first region of the substrate 100 to form a first impurity region 112 at an upper portion of the substrate 100. The second photoresist pattern 110 may then be removed by, e.g., an ashing process and/or a stripping process.

Figure 6:
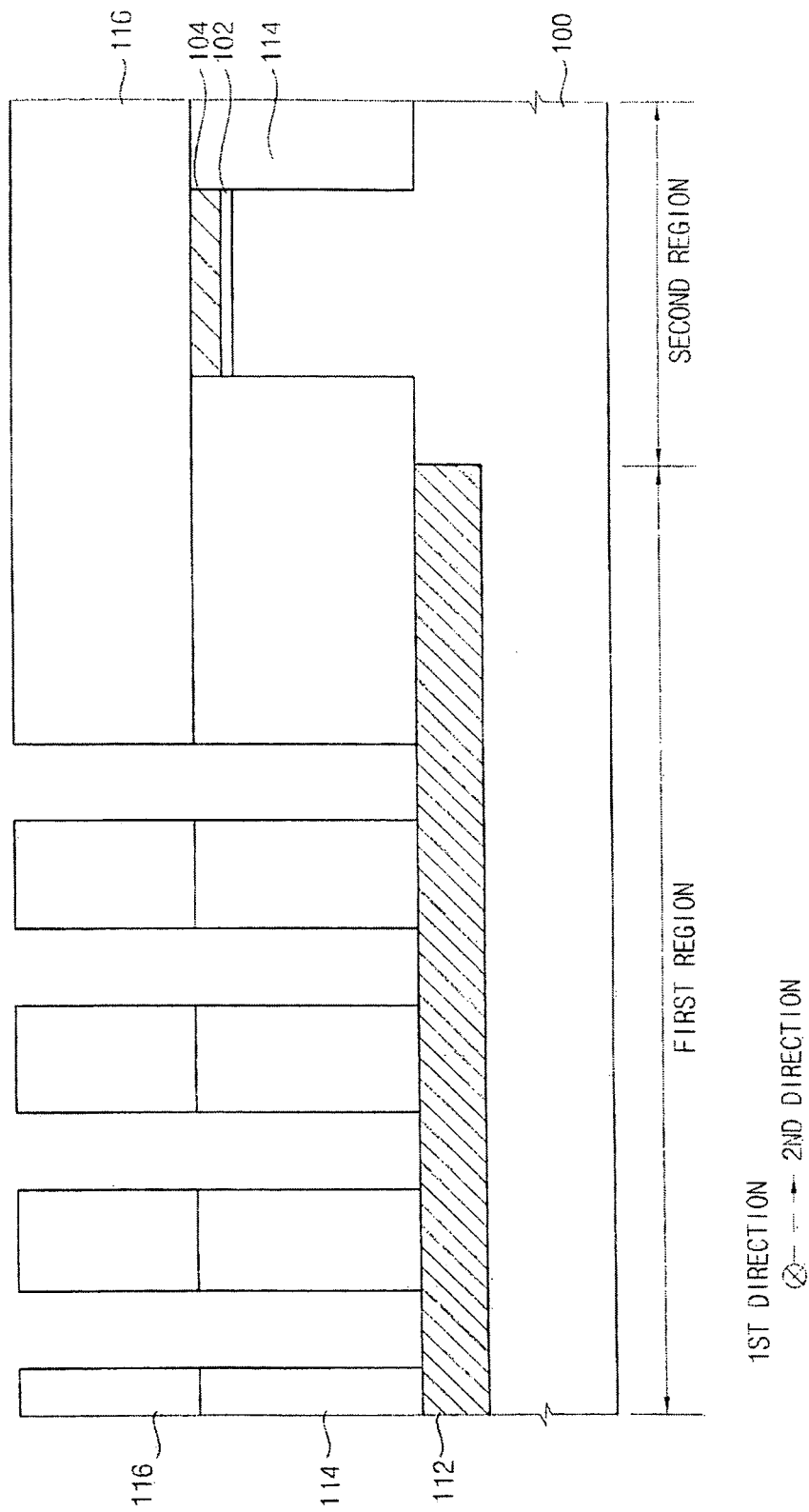

Referring to FIG. 6, a second hard mask layer (not illustrated) may be formed on the substrate 100 so as to cover the first hard mask 104 and the pad oxide layer pattern 102. The second hard mask layer may be formed from a material having an etching selectivity with respect to the first hard mask 104. In an implementation, the second hard mask layer may be formed from, e.g., silicon oxide. An upper portion of the second hard mask layer may be planarized until a top surface of the first hard mask 104 is exposed.

A third photoresist pattern 116 may be formed on the second hard mask layer and the first hard mask 104. In the first region, the third photoresist pattern 116 may expose portions of the second hard mask layer extending in a first direction. In the second region, the third photoresist pattern 116 may cover the second hard mask layer and the first hard mask 104.

The second hard mask layer may be patterned using the third photoresist pattern 116 as an etching mask to form a second hard mask 114. The third photoresist pattern 116 may then be removed by, e.g., an ashing process and/or a stripping process.

Figure 7:
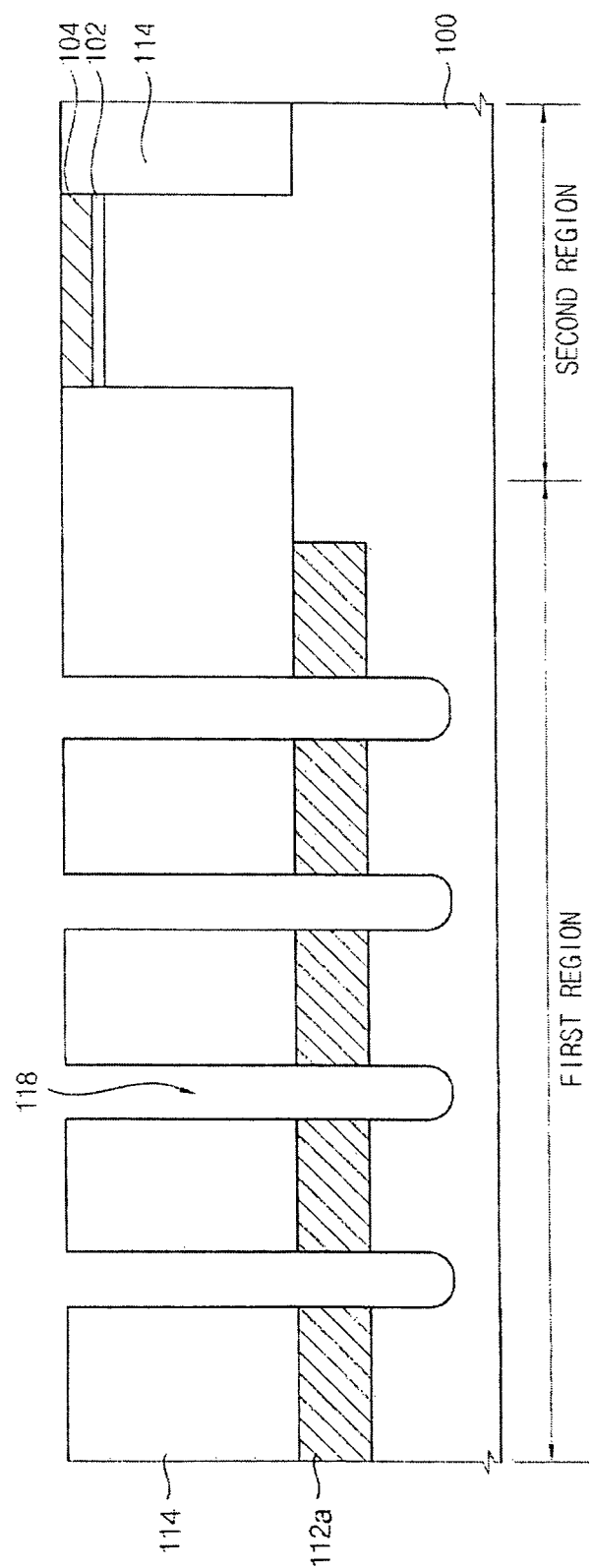

Referring to FIG. 7, portions of the substrate 100 may be partially removed using the second hard mask 114 as an etching mask to form a plurality of trenches 118 at upper portions of the first region of the substrate 100. These portions of the substrate 100 may be partially removed by, e.g., an anisotropic etching process.

The trenches 118 may have a depth such that a bottom thereof is lower than a bottom of the first impurity region 112. Thus, a plurality of first impurity regions 112*a* extending in the first direction and serving as a bit line may be defined by the trenches 118. Additionally, the substrate 100 in the first region may include a plurality of first active regions divided by the trenches 118.

Figure 8:
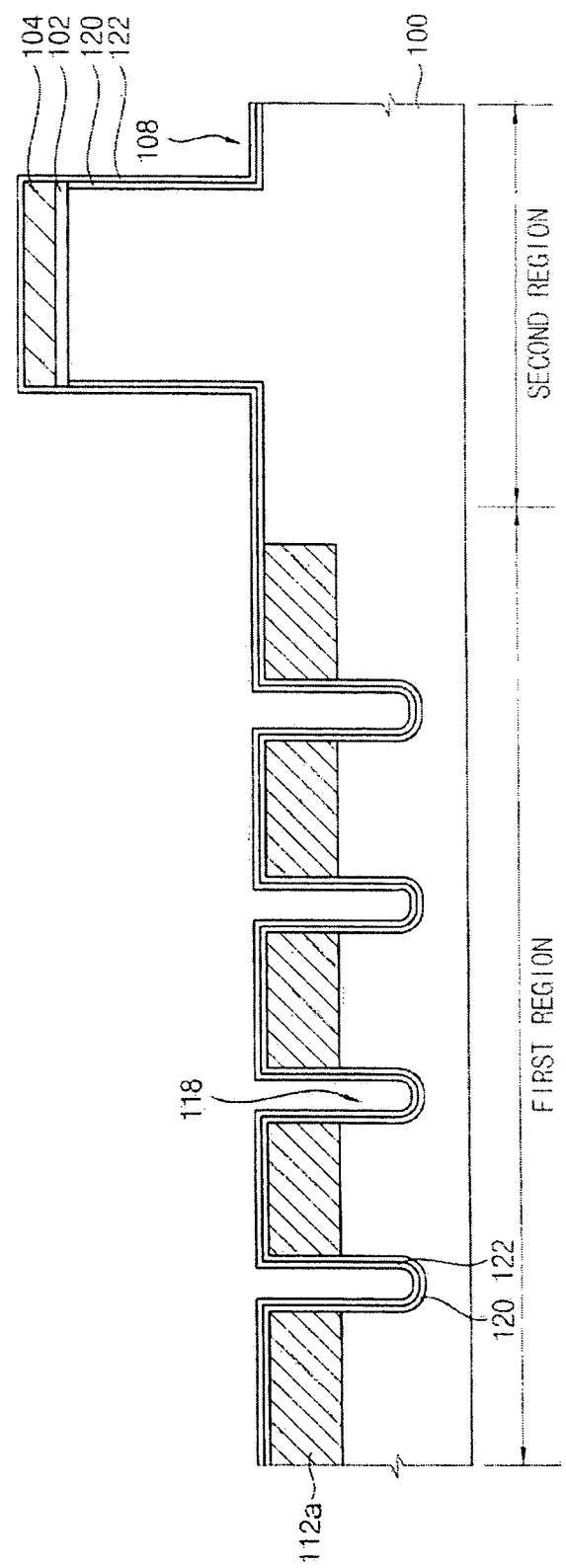

Referring to FIG. 8, the second hard mask 114 may be removed from the substrate 100. In an implementation, the second hard mask 114 may be removed by, e.g., a wet etching process.

A top surface of the substrate 100, including bottoms and sidewalls of the trenches 118, may be thermally oxidized to form an oxide layer 120. A first liner 122 may be formed on the oxide layer 120, the pad oxide layer pattern 102, and the first hard mask 104. The first liner 122 may be formed from, e.g., silicon nitride. In an implementation, one of the oxide layer 120 and the first liner 122 may not be formed in consideration of brevity of process.

Figure 9:
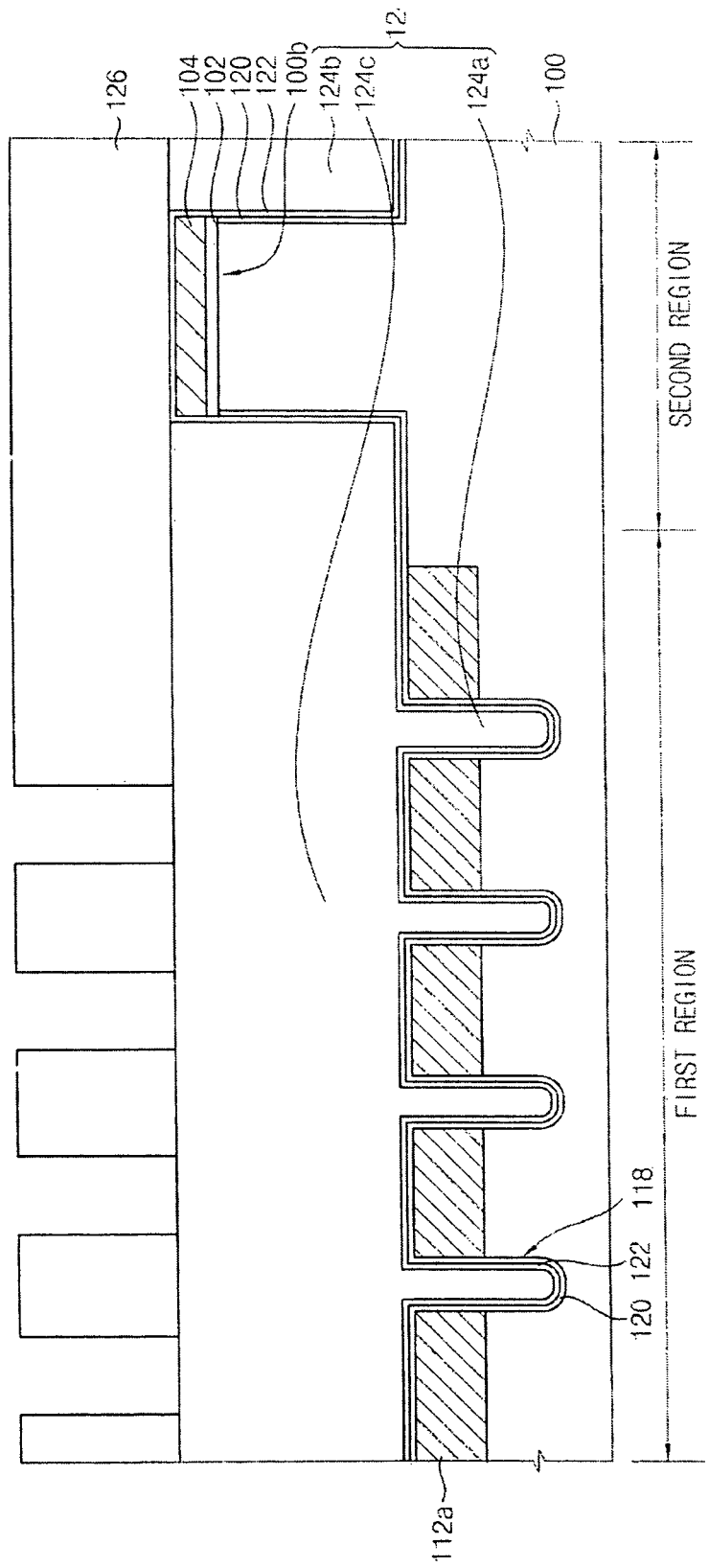

Referring to FIG. 9, an insulation layer 124 may be formed on the first liner 122 so as to fill the trenches 118. The insulation layer 124 may have a height higher than a height of the first liner 122 over the second top surface 100b of the substrate 100 in the second region. The insulation layer 124 may be formed from, e.g., silicon oxide having good gap filling characteristics. An upper portion of the insulation layer 124 may be planarized until the portion of the first liner 122 over the second top surface 100b of the substrate 100 is exposed.

A portion of the insulation layer 124 filling the trenches 118 may be a first isolation layer pattern 124a and a portion of the insulation layer 124 in the second region may be a second isolation layer pattern 124b. Remaining portions of the insulation layer 124 in the first region may be a first insulation layer pattern 124c.

A fourth photoresist pattern 126 may be formed on the first insulation layer pattern 124c, the second isolation layer pattern 124b, and the portion of the first liner 122 over the second top surface 100b of the substrate 100 in the second region. The fourth photoresist pattern 126 may have holes exposing portions of the first insulation layer pattern 124c.

Figure 10:
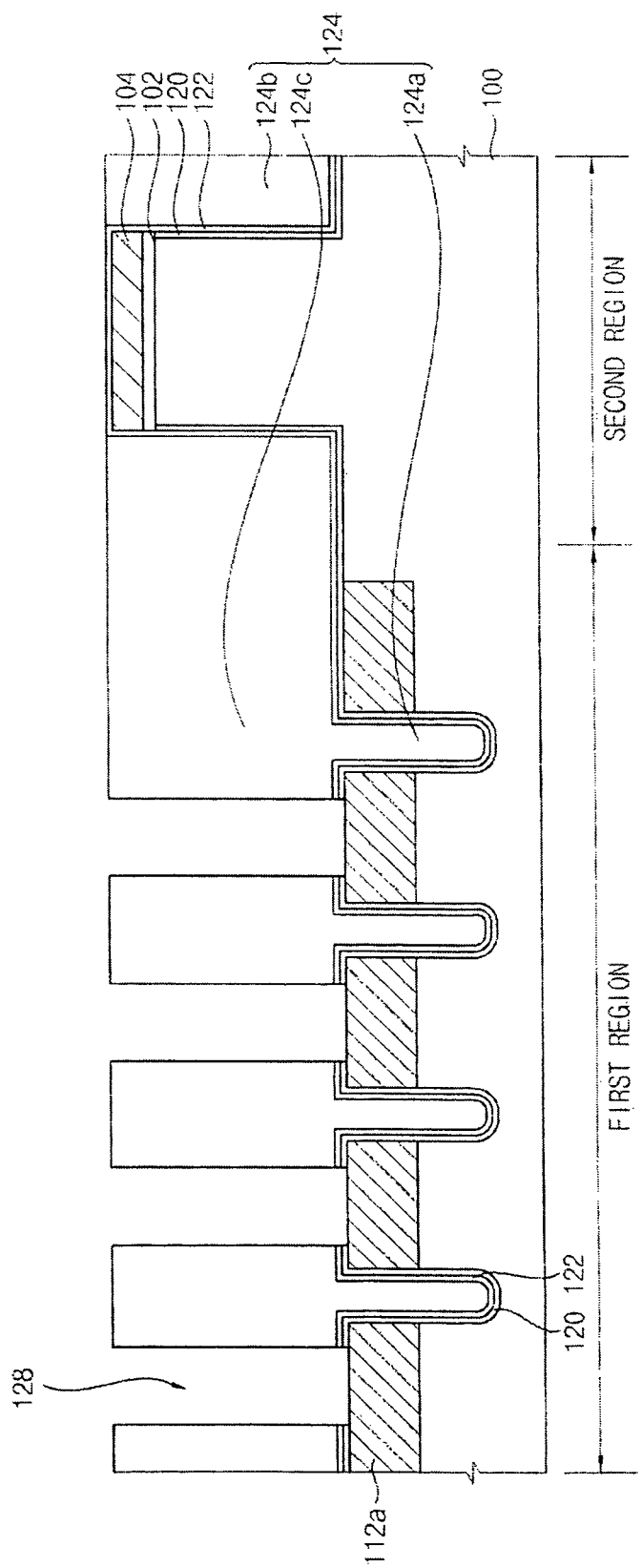

Referring to FIG. 10, the exposed portions of the first insulation layer pattern 124c and portions of the first liner 122 and the oxide layer 120 thereunder may be removed using the fourth photoresist pattern 126 as an etching mask. Thus, openings 128 exposing portions of top surfaces of the substrate 100 in the first region may be formed through the first insulation layer pattern 124c, the first liner 122, and the oxide layer 120. The fourth photoresist pattern 126 may then be removed by, e.g., an ashing process and/or a stripping process.

In a subsequent process, pillars 130 (see FIG. 11) may be formed in the openings 128. Thus, the pillars 130 may have a desired width by controlling a width of the openings 128.

In an implementation, spacers (not shown) may be further formed on sidewalls of the opening 128 so that the pillars 130 may have a narrower width.

Figure 11:
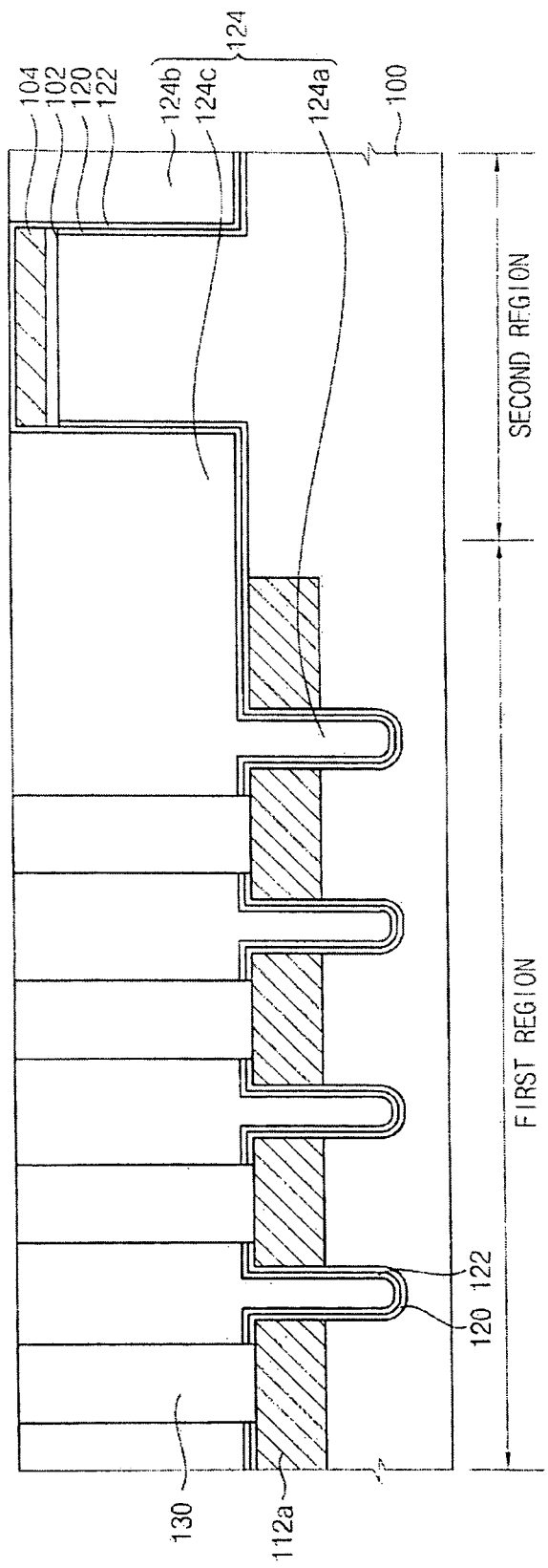

Referring to FIG. 11, the pillars 130 may be formed on the exposed top surfaces of the substrate 100 in the first region to fill the openings 128. The pillars 130 may be formed by, e.g., an epitaxial growth process on the exposed top surfaces of the substrate 100, such that the pillars 130 may include single crystalline silicon and/or single crystalline germanium. The pillars 130 may be formed by, e.g., a selective epitaxial growth (SEG) process or a laser epitaxial growth (LEG) process.

The LEG process may be performed as follows. An amorphous silicon layer may be formed on the substrate 100 and the first insulation layer pattern 124c to fill the openings 128. An upper portion of the amorphous silicon layer may be planarized until a top surface of the first insulation layer pattern 124c is exposed so as to form an amorphous silicon layer pattern in the openings 128. The amorphous silicon layer pattern may be thermally heated using, e.g., a laser beam, so that the amorphous silicon may be transformed into single crystalline silicon. Thus, the pillars 130 having single crystalline silicon may be formed in the openings 128. The pillars 130 may have a height lower than that of the amorphous silicon layer pattern from which they are formed due to, e.g., shrinkage during the transformation.

The SEG process may be performed as follows. A natural oxide layer on bottoms of the openings 128 may be removed to expose top surfaces of the substrate 100. A single crystalline silicon layer may then be grown using the exposed top surfaces of the substrate 100 as a seed. The single crystalline silicon layer may be grown to fill the openings 128; and an upper portion of the single crystalline silicon layer may be planarized to form the pillars 130.

If pillars are formed by etching a bulk silicon substrate, after forming the pillars, an isolation layer pattern may be formed by etching the bulk silicon substrate. Additionally, a bit line may be formed by implanting impurities into the bulk substrate. However, according to an embodiment, the pillars having single crystalline silicon may not be damaged due to the above processes. Furthermore, forming the isolation layer pattern may be easy because a trench for forming the isolation layer pattern may not be too deep.

The pillars 130 formed according to an embodiment may not be damaged because the pillars 130 may be formed after forming the bit line 112a and the isolation layer patterns 124a and 124b. Additionally, the trenches 118 may not have a deep depth, so that the first isolation layer pattern 124a may be easily formed.

In an implementation, impurities may then be implanted into the pillars 130 to form a second impurity region 138 (see FIG. 13) serving as a first source/drain region.

Figure 12:
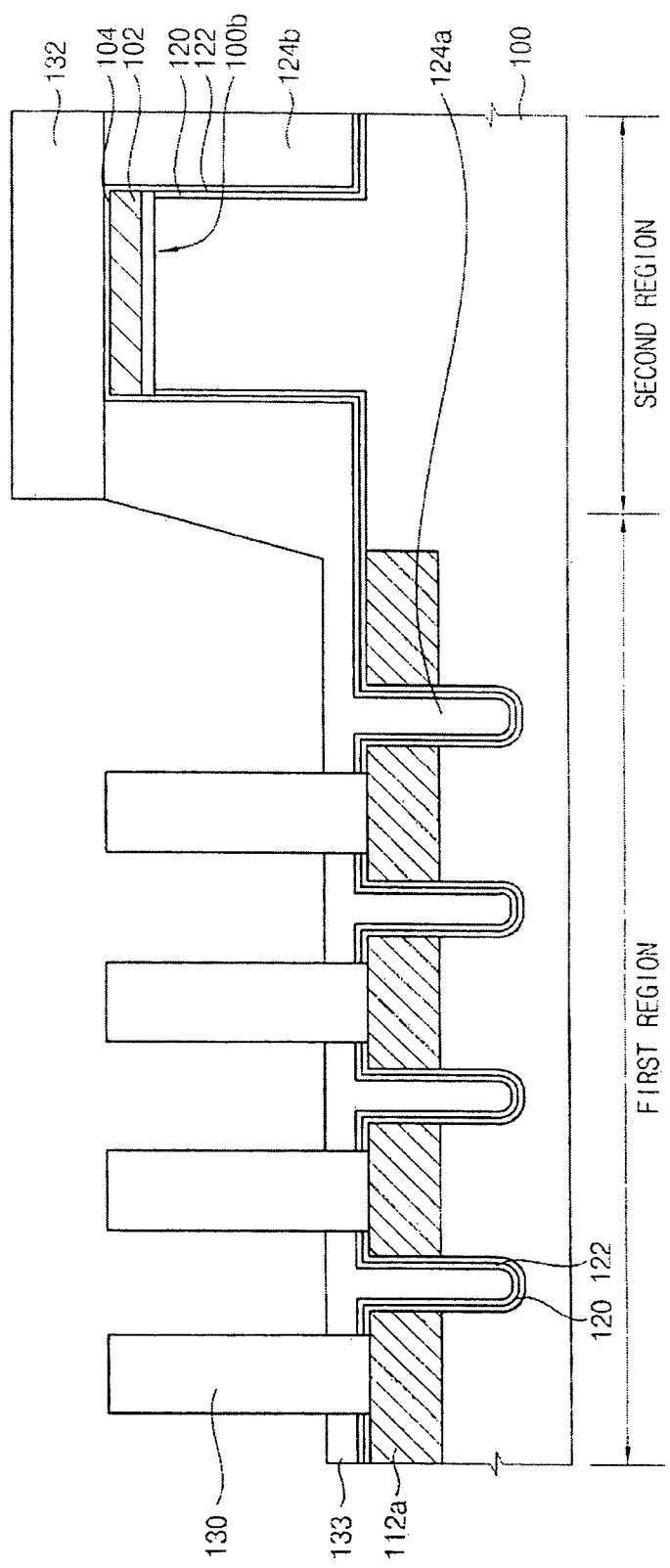

Referring to FIG. 12, a fifth photoresist pattern 132 may be formed on the second insulation layer pattern 124b and the portion of the first liner 122 over the second top surface 100b of the substrate 100 in the second region.

An upper portion of the first insulation layer pattern 124c may be removed using the fifth photoresist pattern 132 as an etching mask to form an insulation layer pattern 133 in the first region. Thus, sidewalls of the pillars 130 may be exposed. In an implementation, the upper portion of the first insulation layer pattern 124c may be removed by, e.g., a wet etching process.

The insulation layer pattern 133 may surround lower portions of the pillars 130. Further, upper portions of the pillars 130 may protrude from the insulation layer pattern 133. The fifth photoresist pattern 132 may then be removed by, e.g., an ashing process and/or a stripping process.

Figure 13:
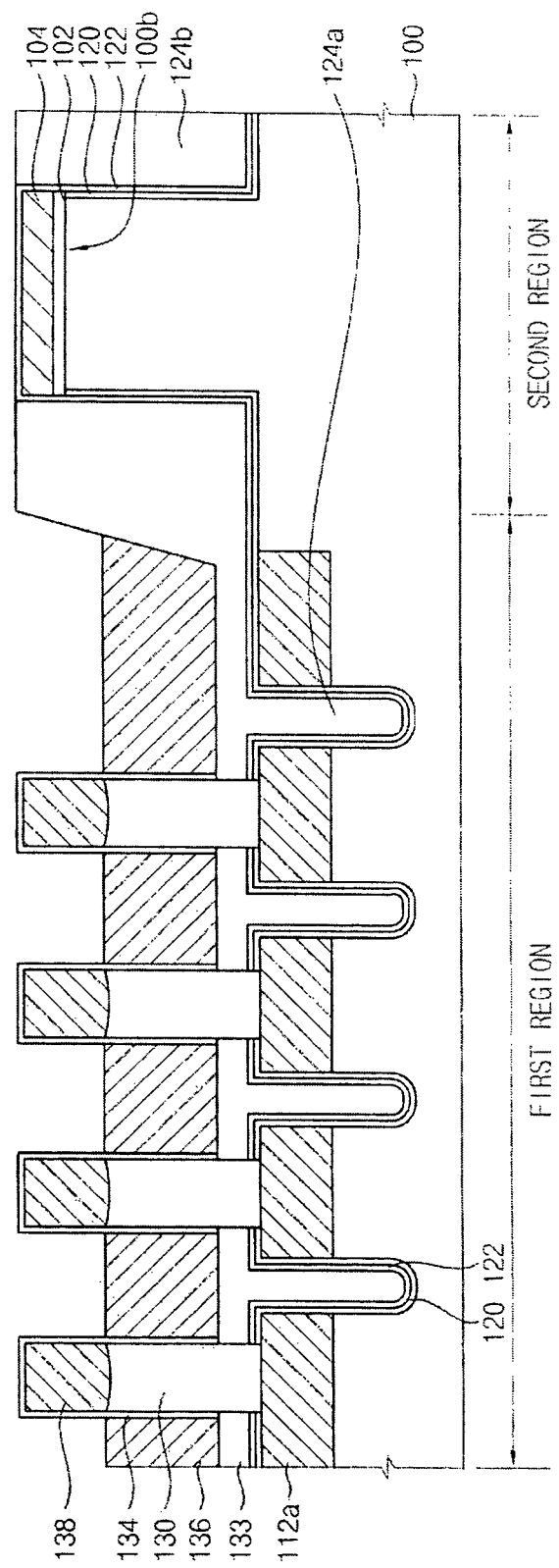

Referring to FIG. 13, a first gate insulation layer 134 may be formed on exposed surfaces of the pillars 130. The first gate insulation layer 134 may be formed by, e.g., thermally oxidizing the exposed surfaces of the pillars 130 to form silicon oxide. In an alternative implementation, the first gate insulation layer 134 may be formed by depositing silicon oxide on the exposed surfaces of the pillars through, e.g., a CVD process.

A gate conductive layer 136 may be formed on the insulation layer pattern 133 to cover the first gate insulation layer 134 and the pillars 130. The gate conductive layer 136 may be formed from, e.g., polysilicon, a metal such as tungsten, tantalum, aluminum, etc., a metal nitride such as tungsten nitride, tantalum nitride, aluminum nitride, etc., and/or a metal silicide such as tungsten silicide, tantalum silicide, etc.

An upper portion of the gate conductive layer 136 may be planarized until portions of the first gate insulation layer 134 on top surfaces of the pillars 130 are exposed. An upper portion of the planarized gate conductive layer 136 may then be removed so that the gate conductive layer 136 may have a height lower than that of the pillars 130. The upper portion of the planarized gate conductive layer 136 may be removed by, e.g., a dry etching process or a wet etching process. Thus, the gate conductive layer 136 may surround portions of the first gate insulation layer 134 on central portions of the pillars 130. That is, the gate conductive layer 136 may have a height lower than a height of the portion of the first liner 122 over the second top surface 100b of the substrate in the second region.

The pillars 130 may protrude from a top surface of the gate conductive layer 136. That is, portions of the first gate insulation layer 134 on upper portions of the pillars 130 may be exposed.

Impurities may be implanted into upper portions of the pillars 130 to form the second impurity region 138, which may serve as a first source/drain region. If the second impurity region 138 has been previously formed, as described above, this process may be omitted here.

Figure 14:
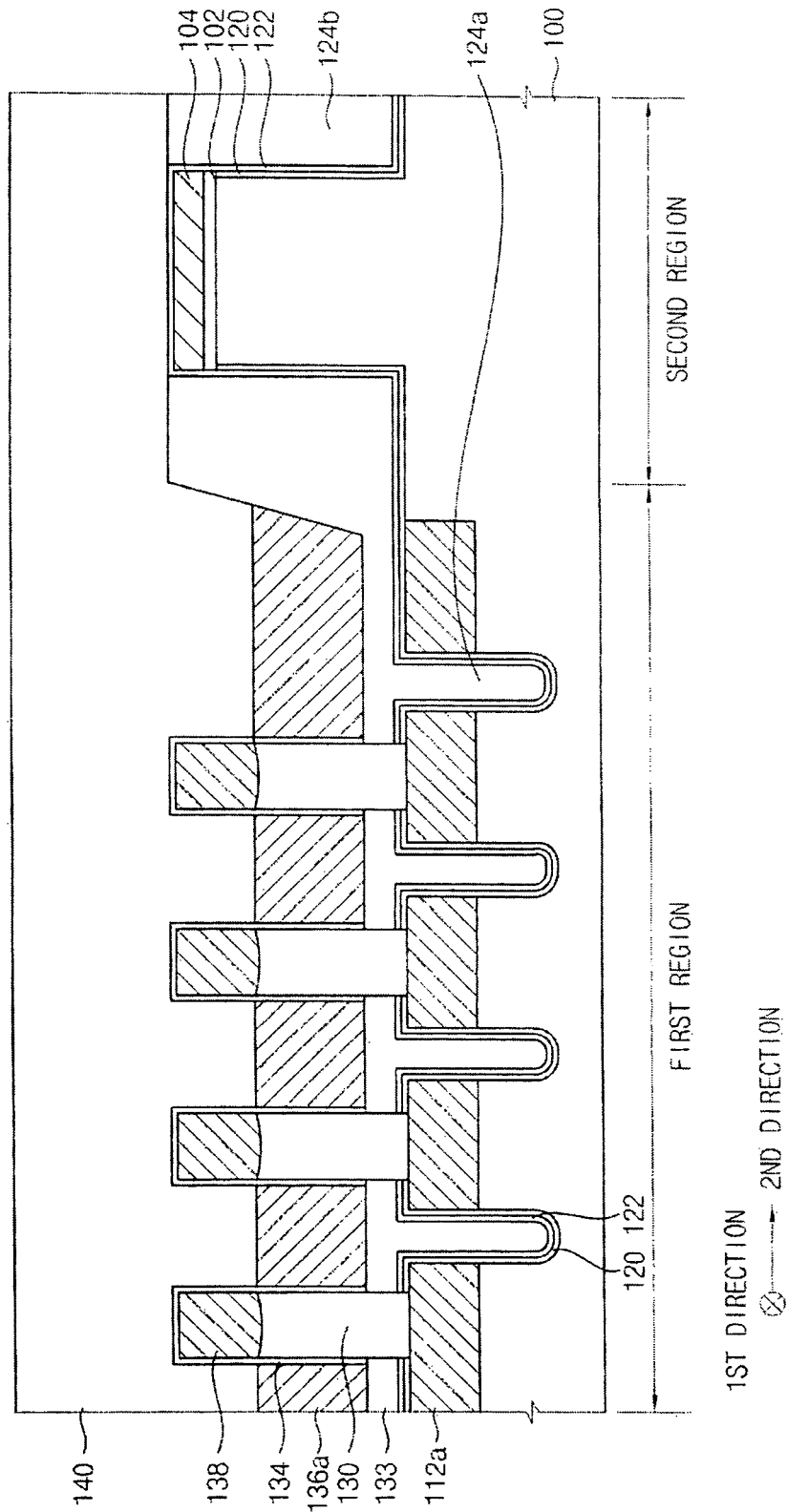
Figure 15:
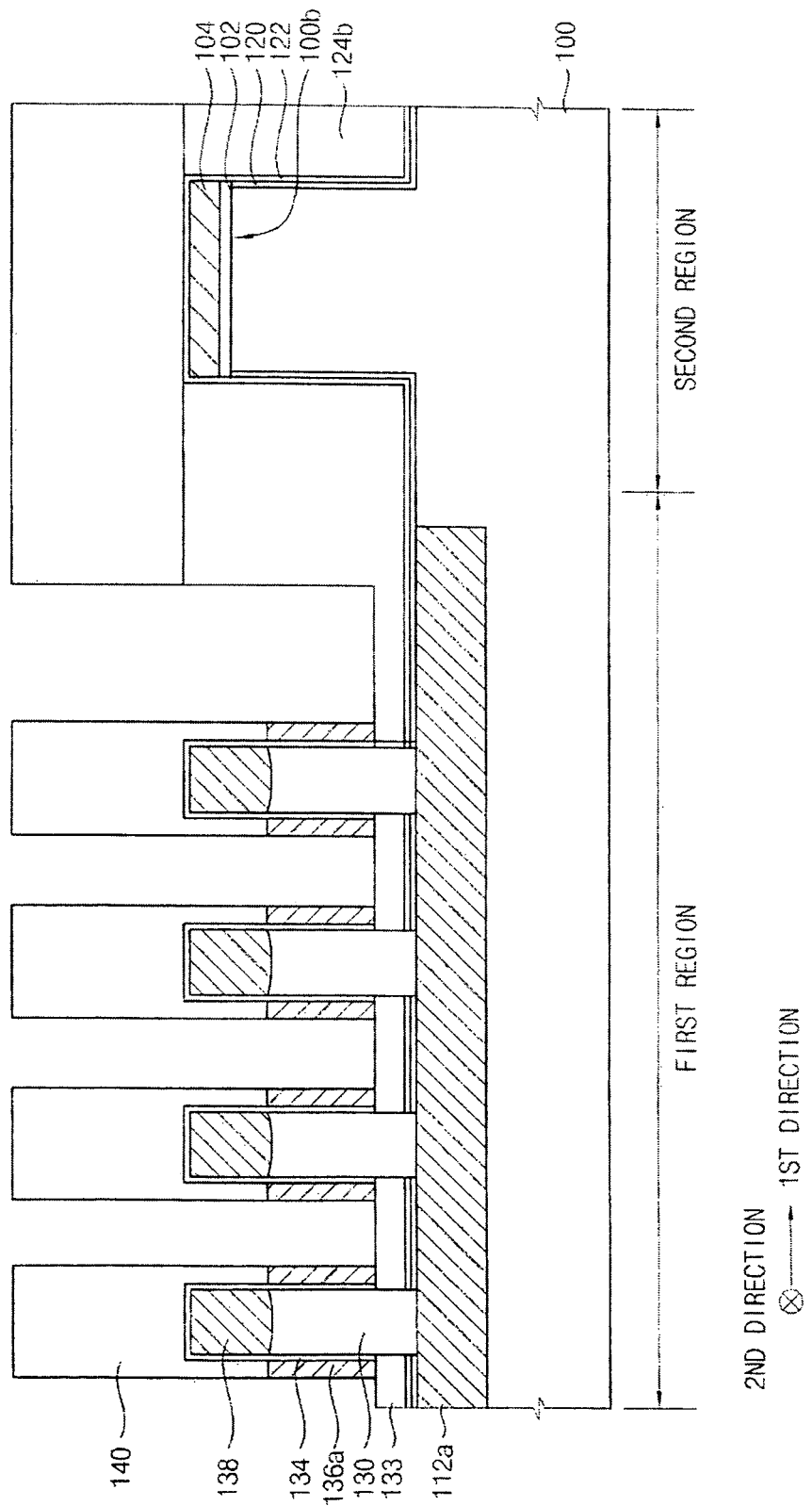

FIGS. 14 and 15 illustrate cross-sectional views of a stage in a method of forming a gate electrode 136a from the gate conductive layer 136 according to an embodiment. In particular, FIG. 14 illustrates a cross-sectional view of the semiconductor device taken along the second direction; and FIG. 15 illustrates a cross-sectional view of the semiconductor device taken along the first direction.

Referring to FIGS. 14 and 15, a sixth photoresist pattern 140 may be formed on the first gate insulation layer 134, the gate electrode 136a, the second isolation layer pattern 124b, and the portion of the first liner 122 over the second top surface 100b of the substrate 100 in the second region. The sixth photoresist pattern 140 may have holes therethrough in the first region, each hole extending in the second direction. The sixth photoresist pattern 140 may cover the pillars 130 in the first region and the substrate 100 in the second region.

The gate conductive layer 136 may be etched using the sixth photoresist pattern 140 as an etching mask to form a plurality of first gate electrodes 136a. Each first gate electrode 136a may extend in the second direction and surround the central portions of the pillars 130. The first gate electrodes 136a may serve as a word line. The sixth photoresist pattern 140 may then be removed.

As illustrated above, vertical channel transistors may be formed on the substrate 100 in the first region.

Figure 16:
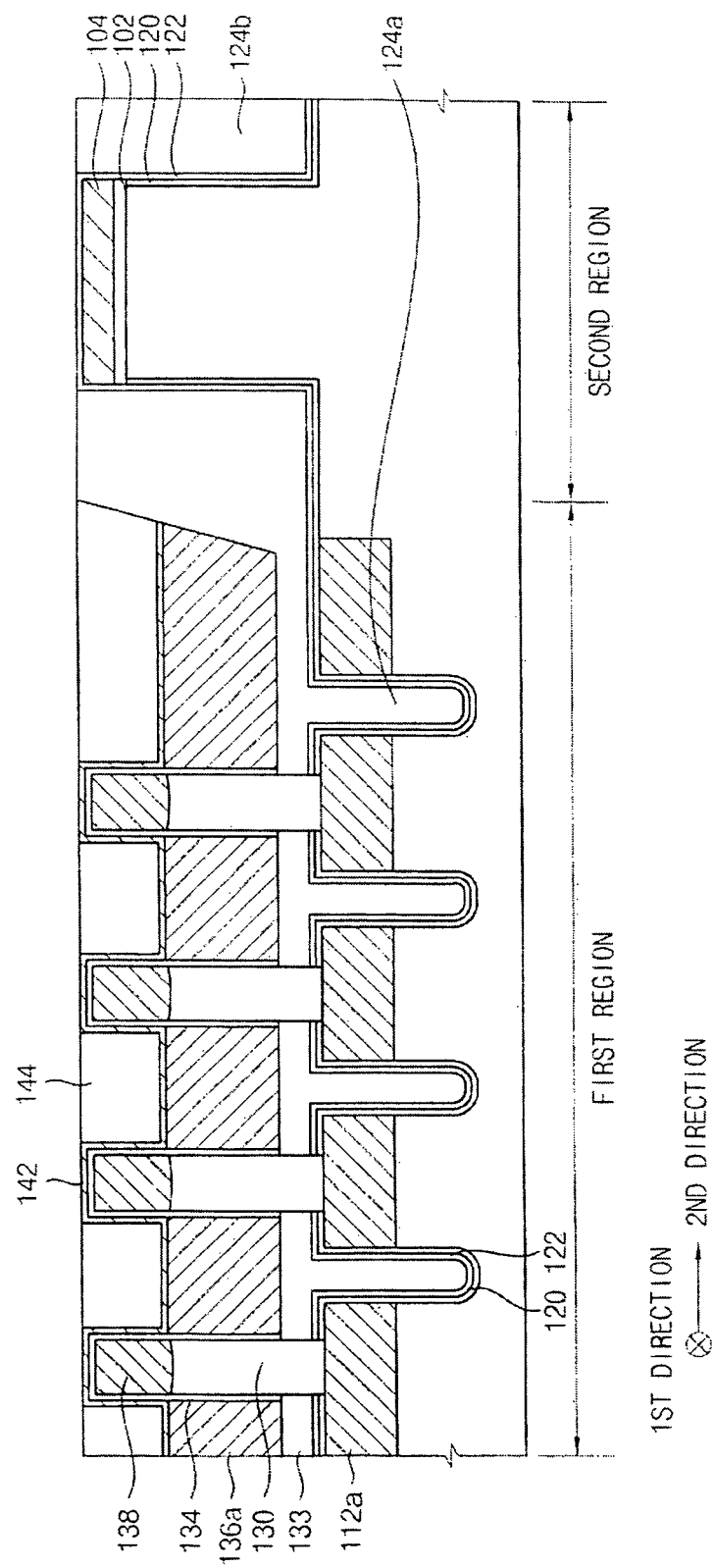
Figure 17:
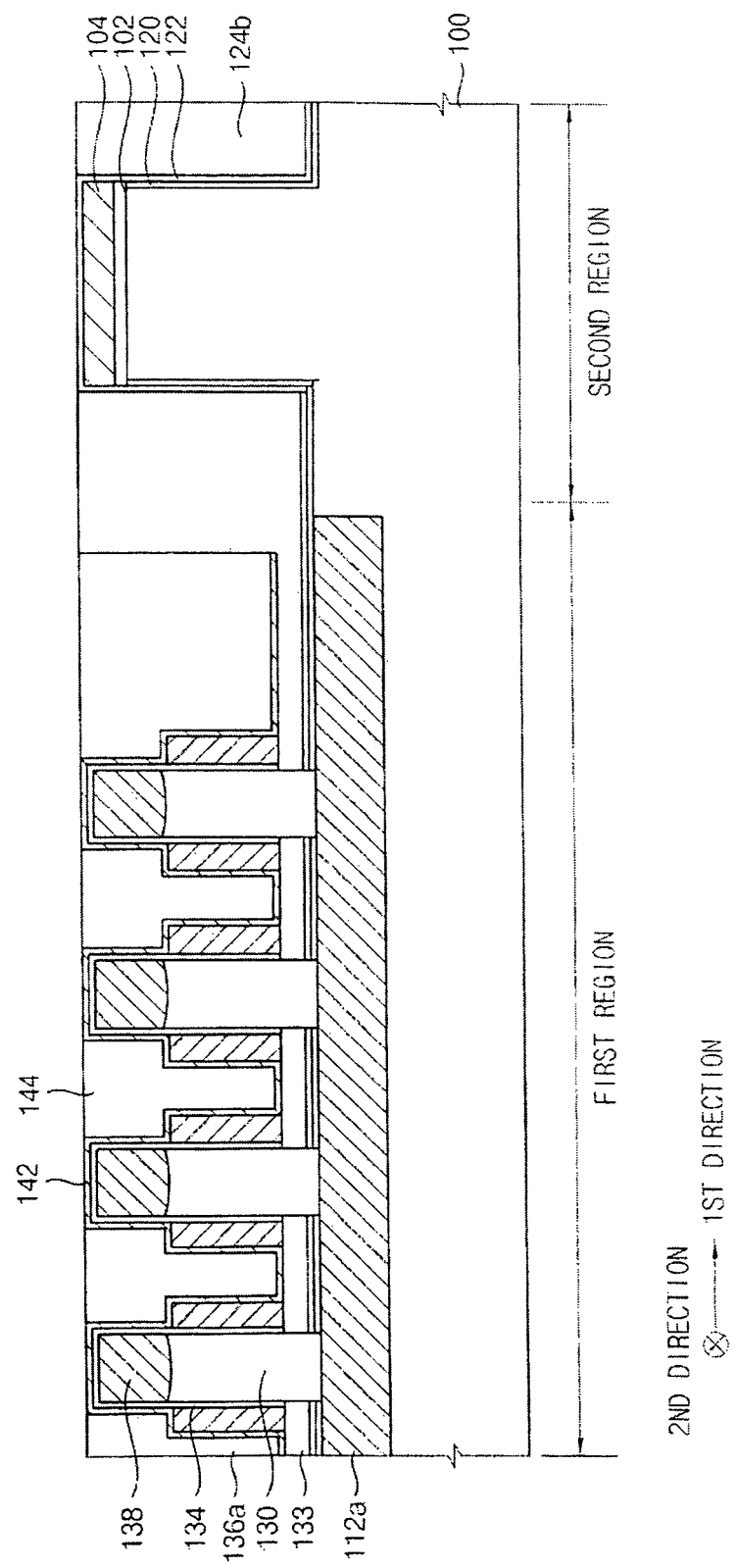

FIGS. 16 and 17 illustrate cross-sectional views of a stage in a method of forming an insulating interlayer 144 between the gate electrodes 136a and between the pillars 130. In particular, FIG. 16 illustrates a cross-sectional view of the semiconductor device taken along the second direction; and FIG. 17 illustrates a cross-sectional view of the semiconductor device taken along the first direction.

Referring to FIGS. 16 and 17, a second liner 142 may be formed on the first gate electrodes 136a, the first gate insulation layer 134, and the insulation layer pattern 133. The second liner 142 may be formed from, e.g., silicon nitride. The second liner 142 may protect the gate electrodes 136a and the pillars 130.

The insulating interlayer 144 may be formed on the first and second liners 122 and 142 and the second isolation layer pattern 124b to fill spaces between the gate electrodes 136a and between the pillars 130. The insulating interlayer 144 may have a height higher than a height of the portion of the first liner 122 over the second top surface 100b of the substrate 100 in the second region. An upper portion of the insulating interlayer 144 may be planarized until the portion of the first liner 122 over the second top surface 100b is exposed.

Figure 18:
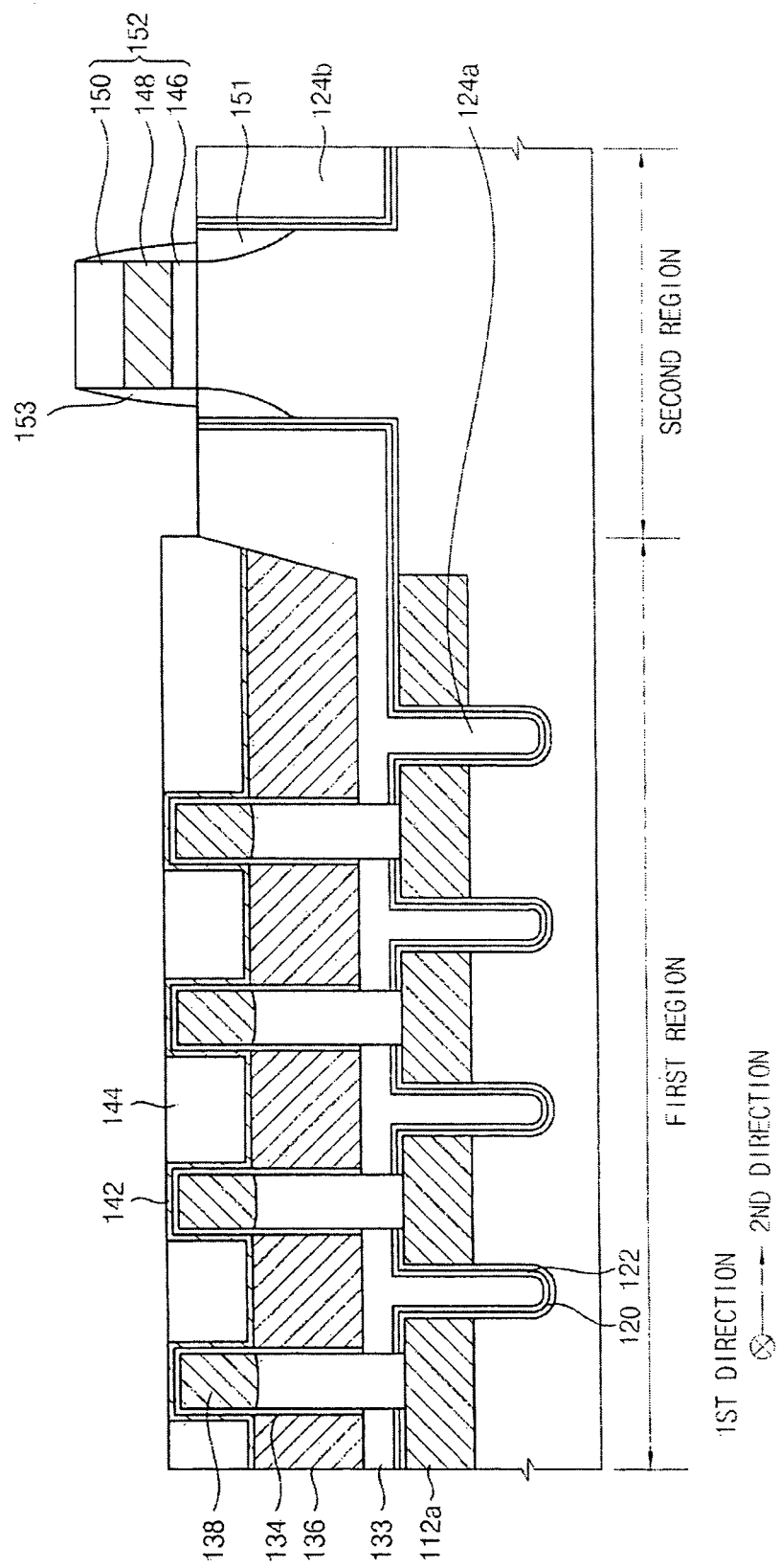
FIGS. 18 and 19 illustrate cross-sectional views of stages in a method of forming a planar transistor on the substrate 100 in the second region.
Figure 19:
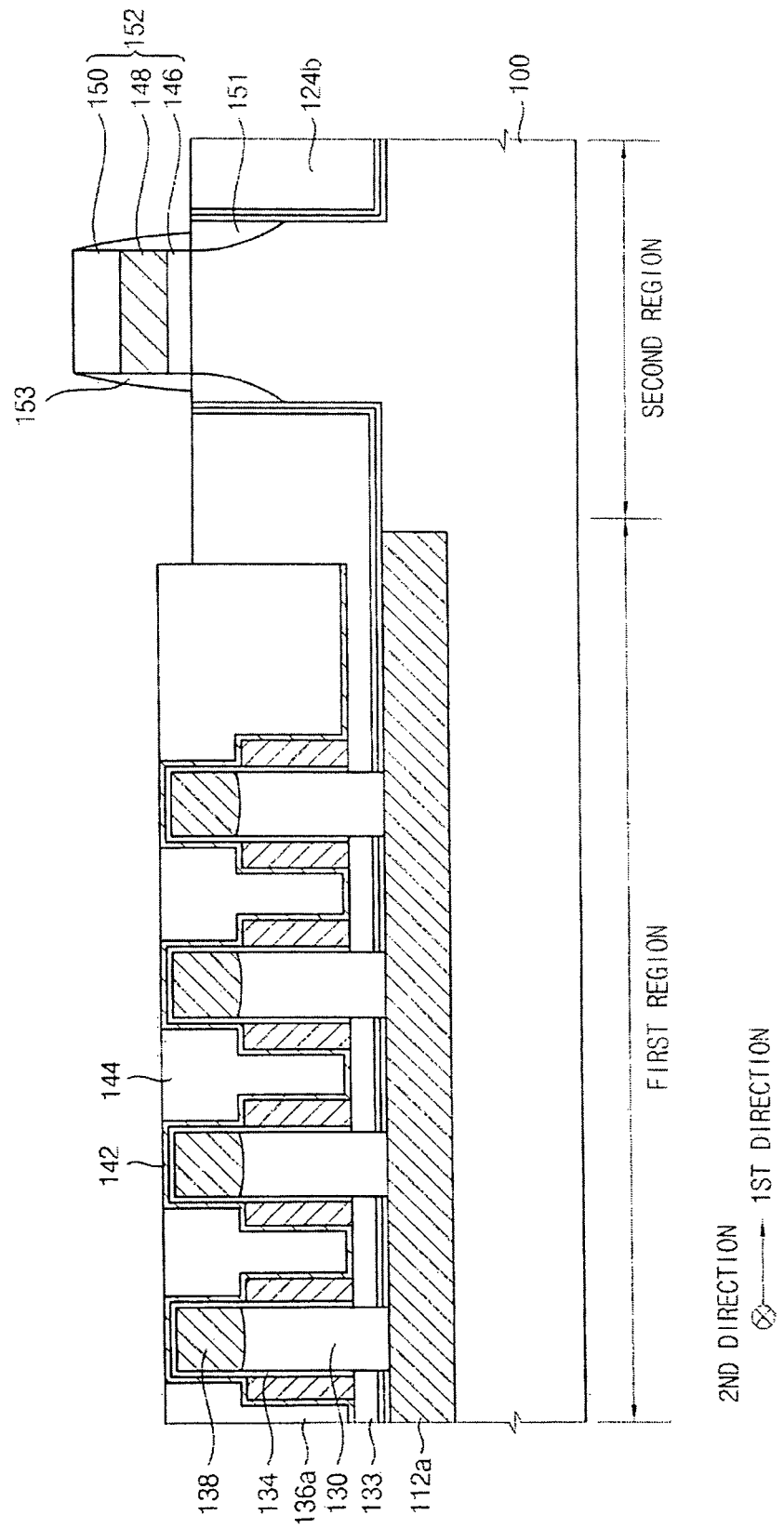

FIGS. 18 and 19 illustrate cross-sectional views of a stage in a method of forming a planar transistor on the substrate 100 in the second region. In particular, FIG. 18 illustrates a cross-sectional view of the semiconductor device taken along the second direction; and FIG. 19 illustrates a cross-sectional view of the semiconductor device taken along the first direction.

Referring to FIGS. 18 and 19, portions of the first liner 122, the first hard mask 104, and the pad oxide layer pattern 102 over the second top surface 100b of the substrate 100 in the second region may be removed, thereby exposing the second top surface 100b of the substrate 100 in the second region. In the removal process, an upper portion of the second isolation layer pattern 124b may be also removed.

A second gate insulation layer, a conductive layer, and a third hard mask layer may be sequentially formed on the exposed substrate 100 in the second region. The third hard mask layer may be patterned to form a third hard mask 150. The conductive layer and the second gate insulation layer may be patterned using the third hard mask 150 to form a second gate electrode 148 and a second gate insulation layer pattern 146, respectively. The second gate insulation layer pattern 146, the second gate electrode 148, and the third hard mask 150 may form a second gate structure 152. Spacers 153 may be formed on sidewalls of the second gate structure 152. A second source/drain region 151 may be formed at an upper portion of the substrate 100 in the second region by implanting impurities therein. Thus, the planar transistor may be formed.

Referring to FIGS. 2 and 3, capacitors 158 may be formed on the pillars 130 and the insulating interlayer 144 so as to be electrically connected to the pillars 130. Each capacitor 158 may be formed by, e.g., sequentially stacking a lower electrode 158a, a dielectric layer 158b, and an upper electrode 158c on the pillars 130 and the insulating interlayer 144. Prior to forming the lower electrode 158a, portions of the second liner 142 and the first gate insulation layer 134 on the top surfaces of the pillars 130 may be removed. The lower electrode 158a may have a cylindrical shape or a pillar shape.

In an alternative implementation, the capacitors 158 may not be formed so that the semiconductor device may have a 1T structure.

A second insulating interlayer 154 may be formed on the substrate 100, the second isolation layer pattern 124b, the insulation layer pattern 133, and the first insulating interlayer 144 to cover the second gate structure 152. A first contact plug 155a may be formed through the first and second insulating interlayers 144 and 154 and a second contact plug 155b may be formed through the second insulating interlayer 154 and the mask 150. A first wiring 156a may be formed on the second insulating interlayer 154 so as to be electrically connected to the first contact plug 155a. A second wiring 156b may be formed on the second insulating interlayer 154 so as to be electrically connected to the second contact plug 155b. Other wirings (not illustrated) may be further formed on the second insulating interlayer 154 to, be electrically connected to the second source/drain region 151.

As illustrated above, the semiconductor having memory cells including the vertical channel transistors and peripheral circuits including the planar transistors may be manufactured.

Figure 20:
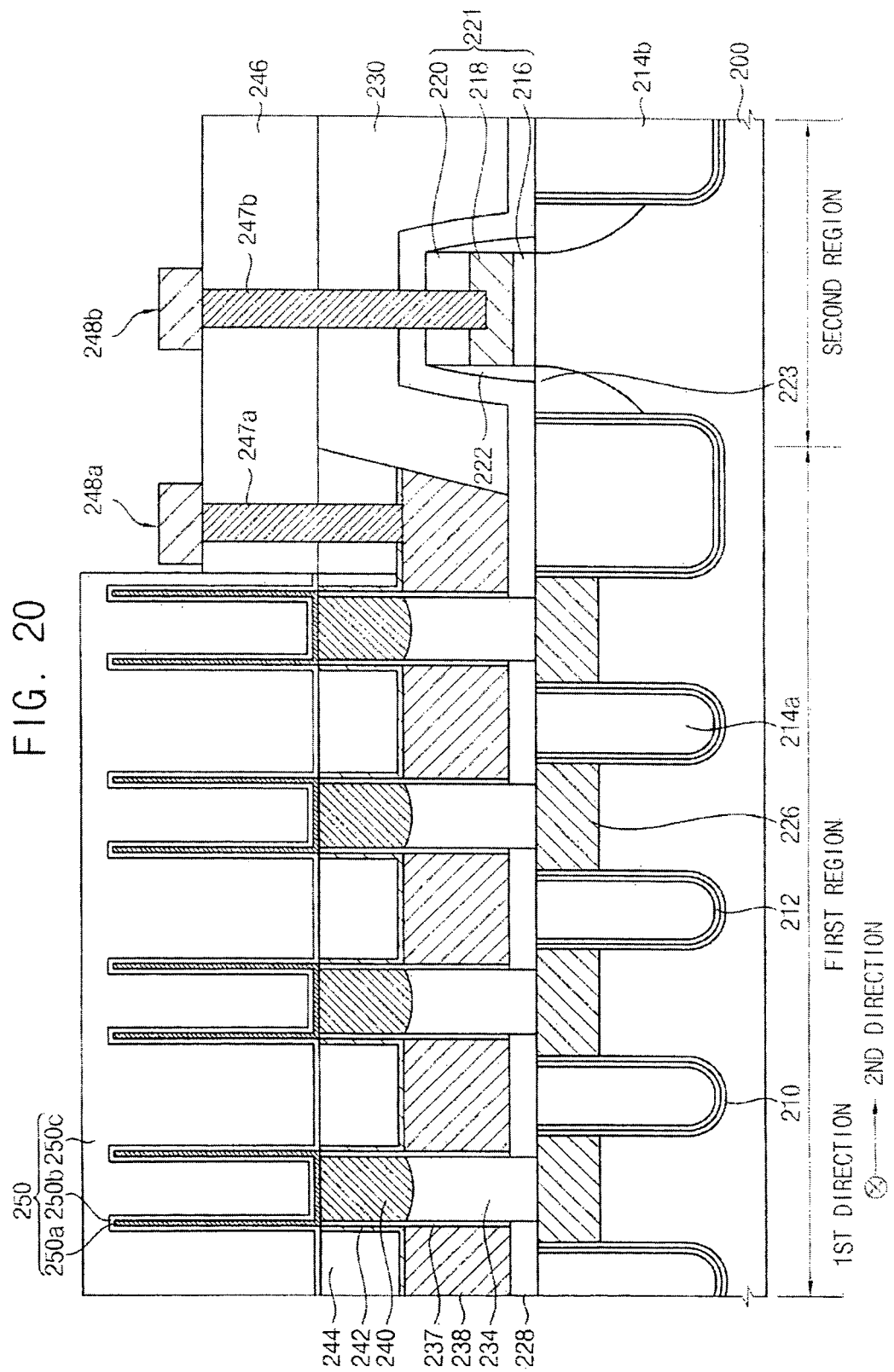
FIGS. 20 and 21 illustrate cross-sectional views of a semiconductor device according another embodiment.
Figure 21:
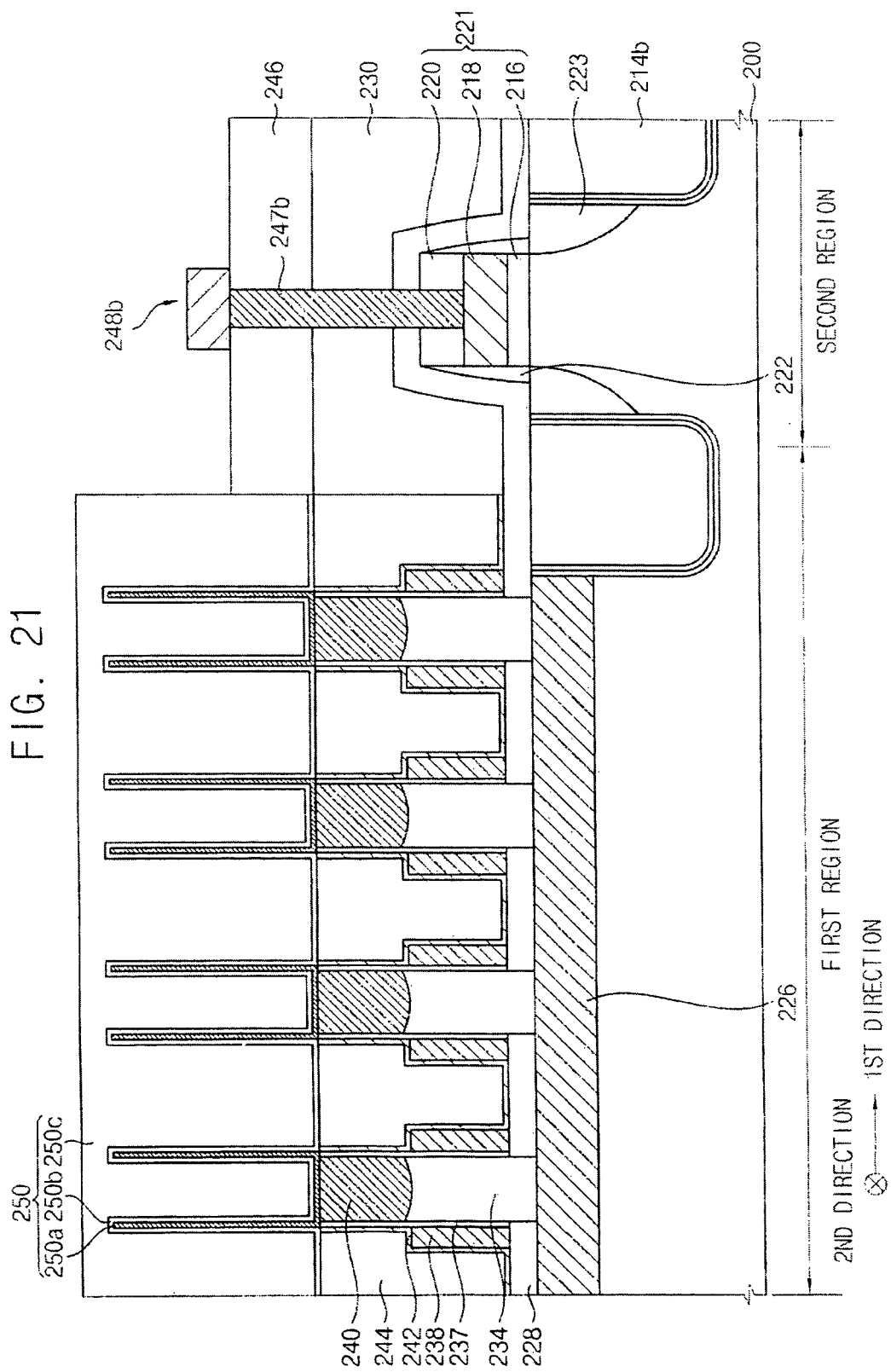

FIGS. 20 and 21 illustrate cross-sectional views of a semiconductor device according to another embodiment. In particular, FIG. 20 illustrates a cross-sectional view of the semiconductor device taken along a second direction; and FIG. 21 illustrates a cross-sectional view of the semiconductor device taken along a first direction perpendicular to the second direction.

Referring to FIGS. 20 and 21, the semiconductor device may have a substrate 200 including a first region and a second region. A top surface of the substrate 200 in the first region may have substantially the same height as, i.e., coplanar with, the second region. An etch stop layer 228 may be formed between the substrate 200 and a first gate electrode 238. The etch stop layer 228 may electrically insulate the substrate 200 and the first gate electrode 238. The etch stop layer 228 may cover a second gate structure 221 and spacers 222 in the second region.

Vertical channel transistors may be formed on the substrate 200 in the first region. The vertical channel transistors may have pillars 234 including single crystalline silicon. An impurity region 240 may be formed at an upper portion of each pillar 234. Each vertical channel transistor may further include the first gate electrode 238 surrounding a central portion of the pillar 234 and a first gate insulation layer 237 on a surface of the pillar 234. A plurality of first source/drain regions 226 serving as bit lines may be formed in upper portions of the substrate 200. Each bit line may extend in the first direction and may electrically connect some of the pillars 234 aligned in the first direction.

A planar transistor may be formed on the substrate 200 in the second region.

The planar transistor may include the second gate structure 221 having a second gate insulation layer pattern 216, a second gate electrode 218, and a mask 220 sequentially stacked on the substrate 200. The planar transistor may further include a second source/drain region 223 in upper portions of the substrate 200 adjacent to the second gate structure 221.

Each vertical transistor and each planar transistor in FIGS. 20 and 21 may have substantially the same structures as those of FIGS. 2 and 3, respectively.

A first isolation layer pattern 214a may be formed on the substrate 200 in the first region and a second isolation layer pattern 214b may be formed on the substrate 200 in the second region. An oxide layer 210 and/or a first liner 212 may be formed between the substrate 200 and the isolation layer patterns 214a and 214b.

A second liner 242 may be formed on the first gate electrode 238, the first gate insulation layer 237, and the etch stop layer 228. A first insulating interlayer 244 may be formed on the second liner 242 to fill spaces between the first gate electrodes 238 and between the pillars 234.

A second insulating interlayer 230 may be formed on the etch stop layer 228 to cover the second gate structure 221. A third insulating interlayer 246 may be formed on the first and second insulating interlayers 244 and 230.

A first contact plug 247a may be formed through the first and third insulating interlayers 244 and 246. A first wiring 248a may be formed on the third insulating interlayer 246 so as to be electrically connected to the first contact plug 248a. A second contact plug 247b may be formed through the second and third insulating interlayers 230 and 246, the etch stop layer 228, and the mask 220. A second wiring 248b may be formed on the third insulating interlayer 246 so as to be electrically connected to the second contact plug 248b. Other wirings (not illustrated) may be further formed on the third insulating interlayer 246 so as to be electrically connected to the second source/drain region 223. Capacitors 250 including a lower electrode 250a, a dielectric layer 250b, and an upper electrode 250c may be formed on the first insulating interlayer 244 so as to be electrically connected to the pillars 234.

FIGS. 22 to 31 illustrate cross-sectional views of stages in a method of manufacturing the semiconductor device in FIGS. 20 and 21 according to an embodiment.

Figure 22:
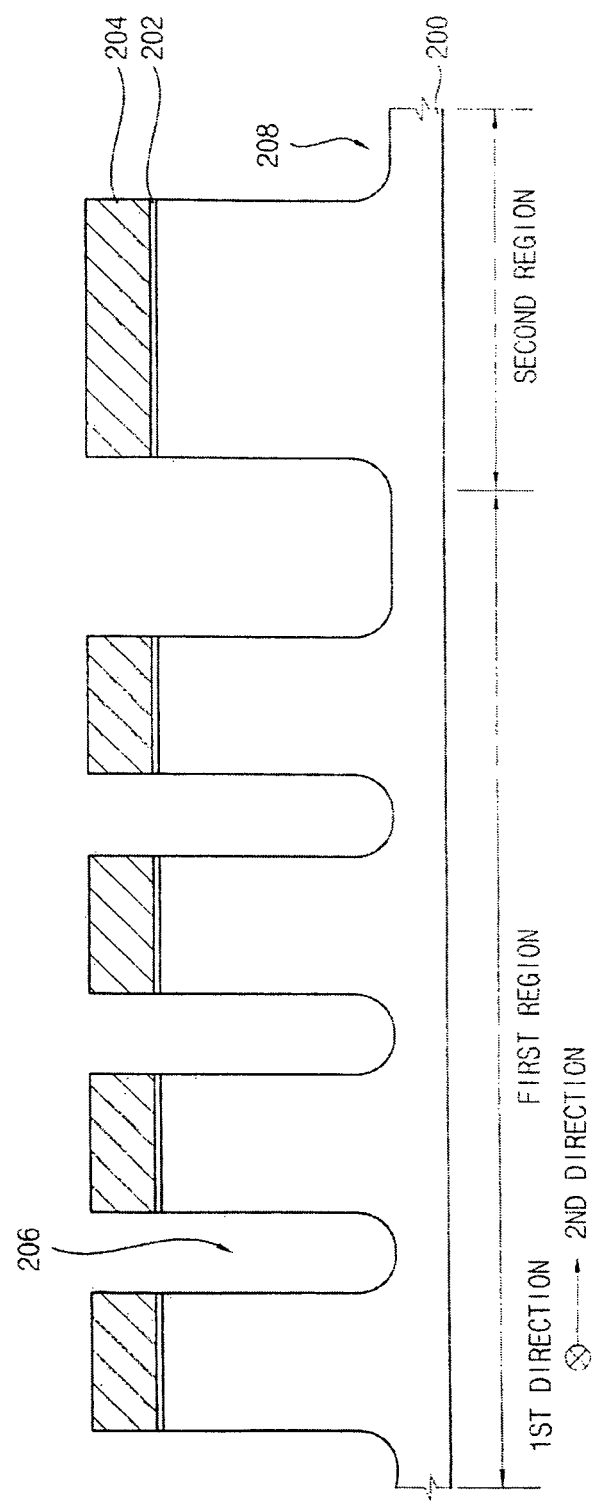
FIGS. 22 to 31 illustrate cross-sectional views of stages in a method of manufacturing the semiconductor device in FIGS. 20 and 21 according to an embodiment.

Referring to FIG. 22, a substrate 200 having a first region and a second region may be provided. The substrate 200 may include, e.g., single crystalline silicon. The first region may serve as a cell region for memory cells and the second region may serve as a peripheral circuit region for peripheral circuits.

A pad oxide layer and a first hard mask layer may be formed on the substrate 200. The pad oxide layer may be formed by, e.g., thermally oxidizing a top surface of the substrate 200. The first hard mask layer may be formed from, e.g., silicon nitride.

A first photoresist pattern may be formed on the first hard mask layer. The first hard mask layer and the pad oxide layer may be patterned using the first photoresist pattern as an etching mask. Thus, a pad oxide layer pattern 202 and a first hard mask 204 may be formed on the substrate 200. The first photoresist pattern may be removed by, e.g., an ashing process and/or a stripping process.

Portions of the substrate 200 may be partially removed using the first hard mask 204 and the pad oxide layer pattern 202 as an etching mask to form first trenches 206 and second trenches 208 at upper portions of the substrate 200 in the first and second regions, respectively. In an implementation, the first trenches 206 may have a width narrower than a width of the second trenches 208.

Impurities may be implanted into the substrate 200 using the first hard mask 204 and the pad oxide layer pattern 202 as an ion implantation mask to form an impurity region (not illustrated).

Figure 23:
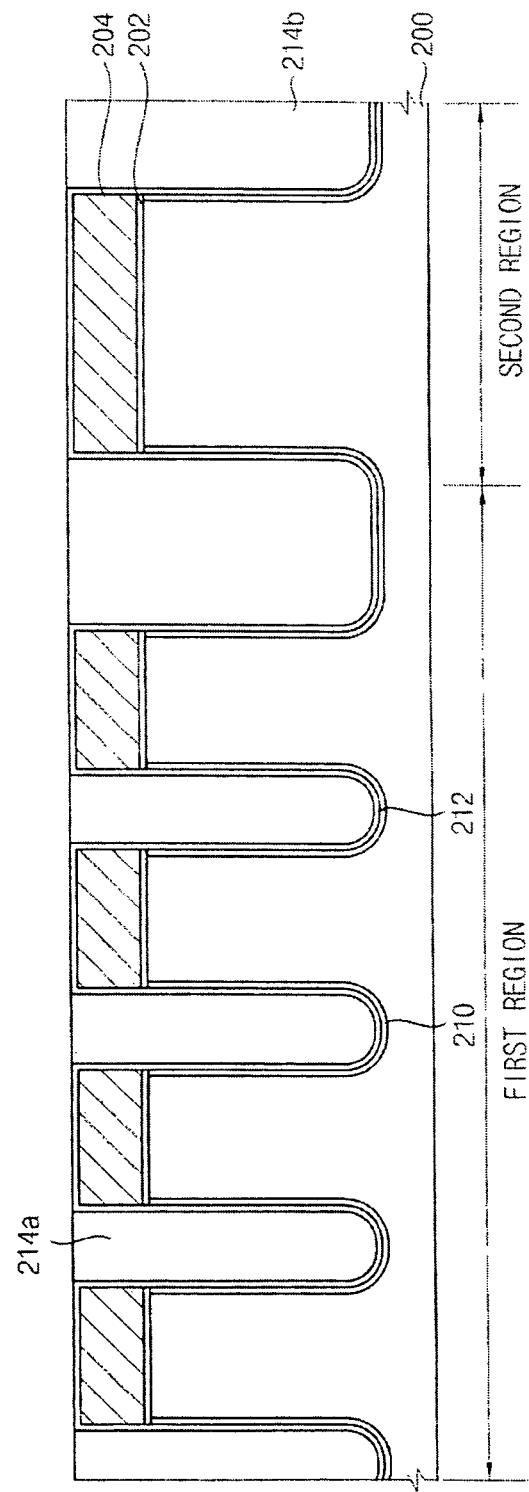

Referring to FIG. 23, a top surface of the substrate 200 including bottoms and sidewalls of the first and second trenches 206 and 208 may be thermally oxidized to form an oxide layer 210. A first liner 212 may be formed on the oxide layer 120, the pad oxide layer pattern 202, and the first hard mask 204. The first liner 212 may be formed from, e.g., silicon nitride.

An insulation layer (not illustrated) may be formed on the first liner 212 to fill the first and second trenches 206 and 208. The insulation layer may be formed from, e.g., silicon oxide having good gap filling characteristics. An upper portion of the insulation layer may be planarized until a portion of the first liner 212 on the first hard mask 204 is exposed.

A portion of the insulation layer filling the first trenches 206 may be a first isolation layer pattern 214a and a portion of the insulation layer filling the second trenches 208 may be a second isolation layer pattern 214b. The substrate 200 may be divided into an active region and an isolation region by the isolation layer patterns 214a and 214b. A portion of the active region in the first region may be a first active region and a portion of the active region in the second region may be a second active region.

Figure 24:
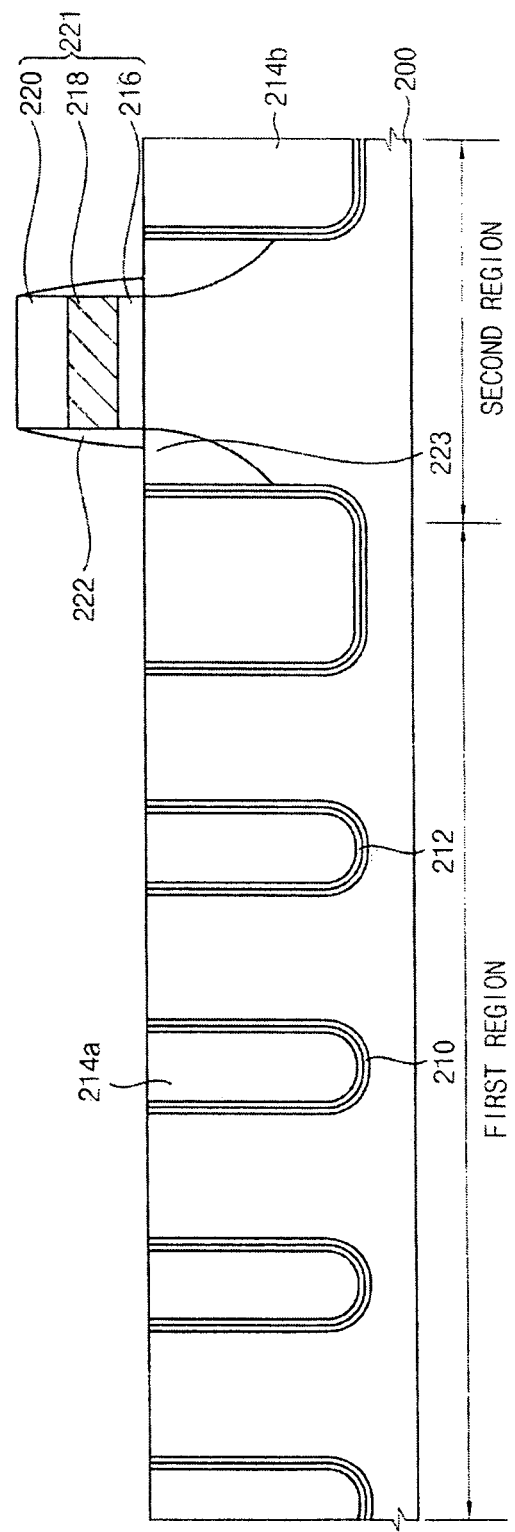

Referring to FIG. 24, a portion of the first liner 212 on the first hard mask 204 and the pad oxide layer pattern 202 may be removed by, e.g., a wet etching process, thereby exposing portions of the substrate 200.

In the wet etching process, an upper portion of the isolation layer patterns 214a and 214b may be removed, such that a top surface of the isolation layer patterns 214a and 214b may have substantially the same height as that of the substrate 200.

A second gate insulation layer, a conductive layer, and a second hard mask layer may be sequentially formed on the exposed portion of the substrate 200 in the second region. The second hard mask layer may be patterned to form a second hard mask 220. The conductive layer and the second gate insulation layer may be patterned using the second hard mask 220 to form a second gate electrode 218 and a second gate insulation layer pattern 216, respectively. The second gate insulation layer pattern 216, the gate electrode 218, and the second hard mask 220 may form a second gate structure 221. Spacers 222 may be formed on sidewalls of the second gate structure 221.

A second photoresist pattern (not illustrated) may be formed on the substrate 200 in the first region. A second source/drain region 223 may be formed at an upper portion of the substrate 200 in the second region adjacent to the second gate structure 221 by implanting impurities therein, using the second photoresist pattern and the second gate structure 221 as an ion implantation mask. Thus, a planar transistor may be formed on the substrate 200 in the second region. The second photoresist pattern may then be removed.

Figure 25:
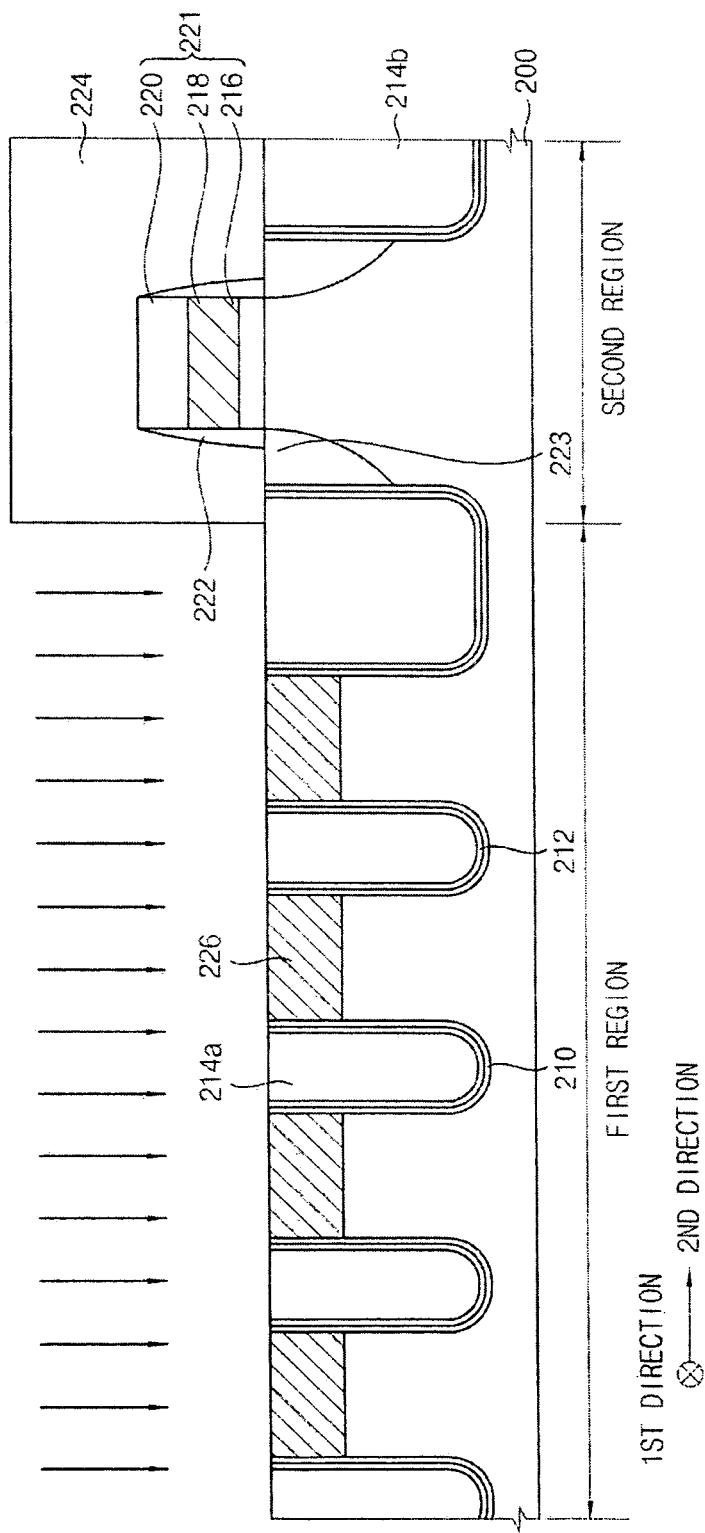

Referring to FIG. 25, a third photoresist pattern 224 may be formed on the substrate 200 in the second region so as to cover the planar transistor. Impurities may be implanted into the substrate 200 in the first region using the third photoresist pattern as an ion implantation mask to form a plurality of first impurity regions 226. Each first impurity region 226 may extend in the first direction and serve as a bit line. The third photoresist pattern 224 may then be removed.

In an alternative implementation, an impurity region may be formed prior to forming the pad oxide layer and the first hard mask layer. In particular, the impurity region may be divided into the first impurity regions 226 by forming the first trenches 206 at upper portions of the substrate 200 in the first region.

Figure 26:
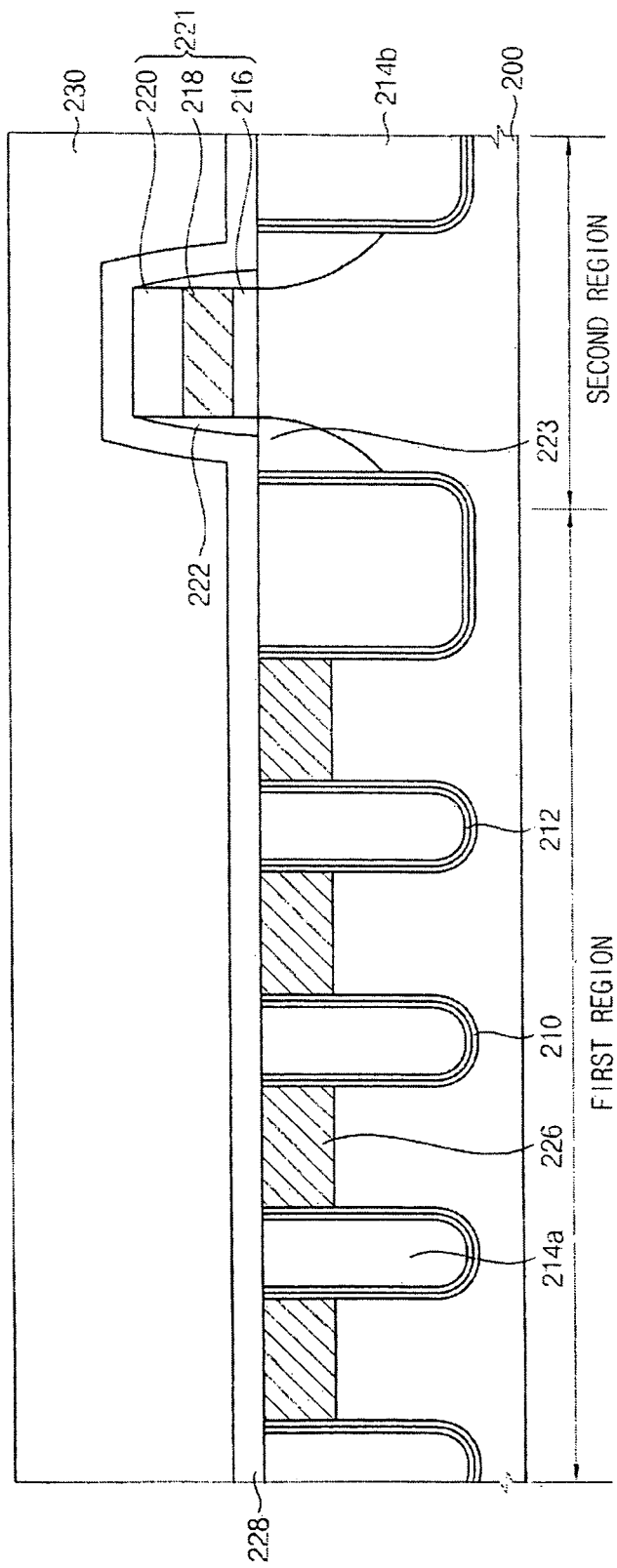

Referring to FIG. 26, an etch stop layer 228 may be formed on the substrate 200, the isolation layer patterns 214a and 214b, the second gate structure 221, and the spacers 222. The etch stop layer 228 may be formed from, e.g., silicon nitride. A second insulating interlayer 230 may be formed on the etch stop layer 228.

Figure 27:
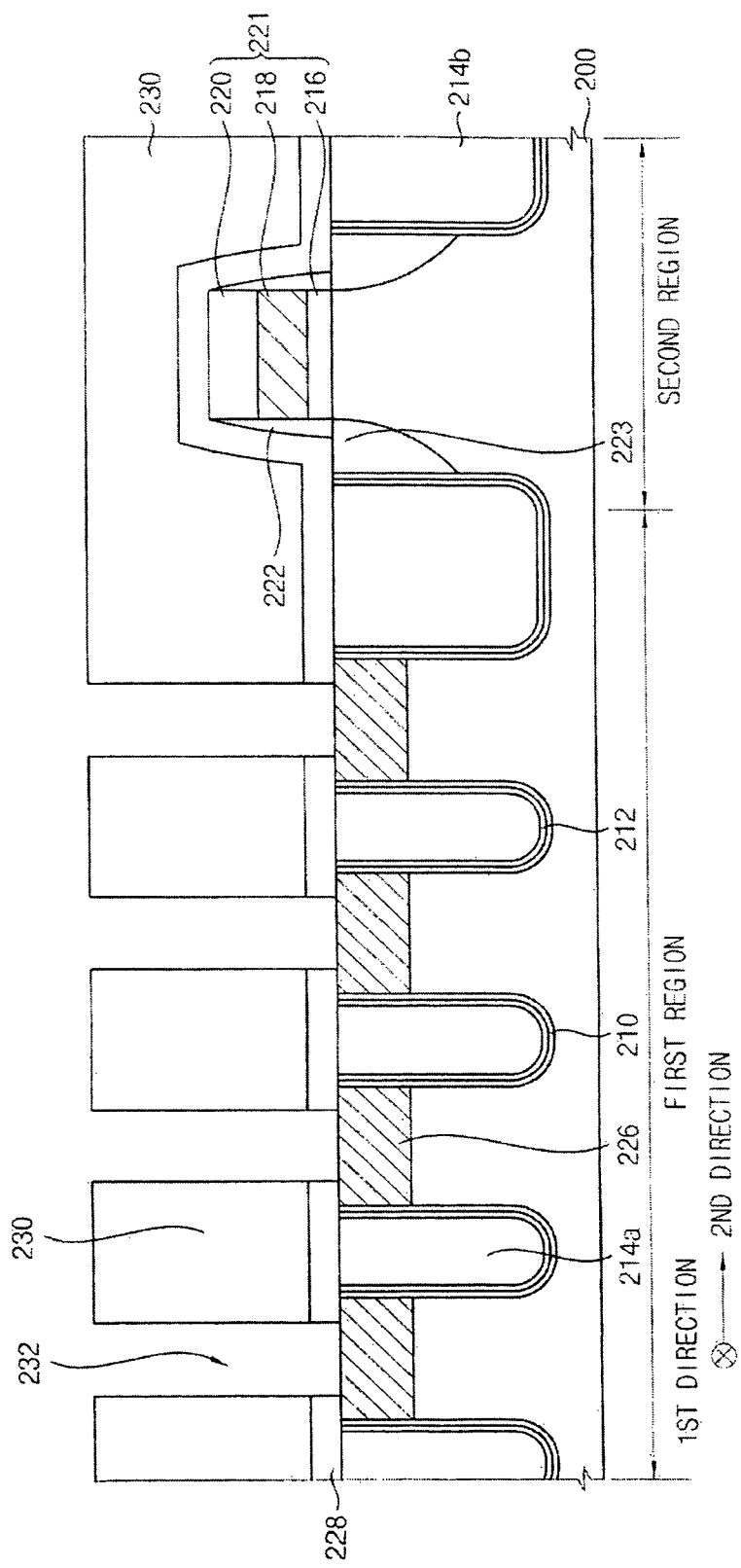

Referring to FIG. 27, a fourth photoresist pattern (not illustrated) may be formed on the second insulating interlayer 230. The fourth photoresist pattern may have holes extending in the first direction. The second insulating interlayer 230 and the etch stop layer 228 may be etched using the fourth photoresist pattern as an etching mask to form openings 232 exposing the first impurity regions 226.

In an implementation, spacers (not illustrated) may be formed on sidewalls of the openings 232, thereby reducing a width of the openings 232.

Figure 28:
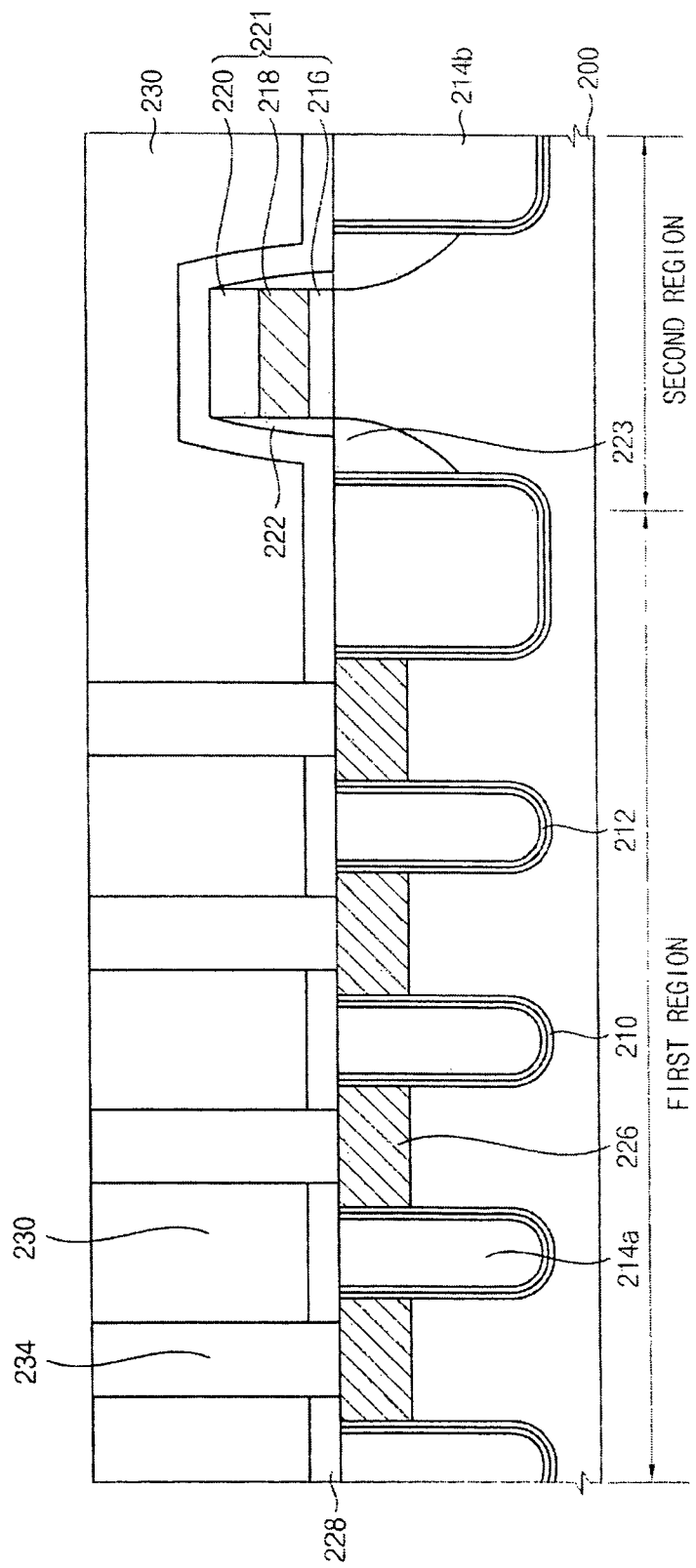

Referring to FIG. 28, pillars 234 may be formed on the first impurity regions 226. The pillars 234 may be formed by, e.g., an SEG process or an LEG process using the exposed first impurity regions 226 as a seed. Thus, the pillars 234 may include single crystalline silicon.

Figure 29:
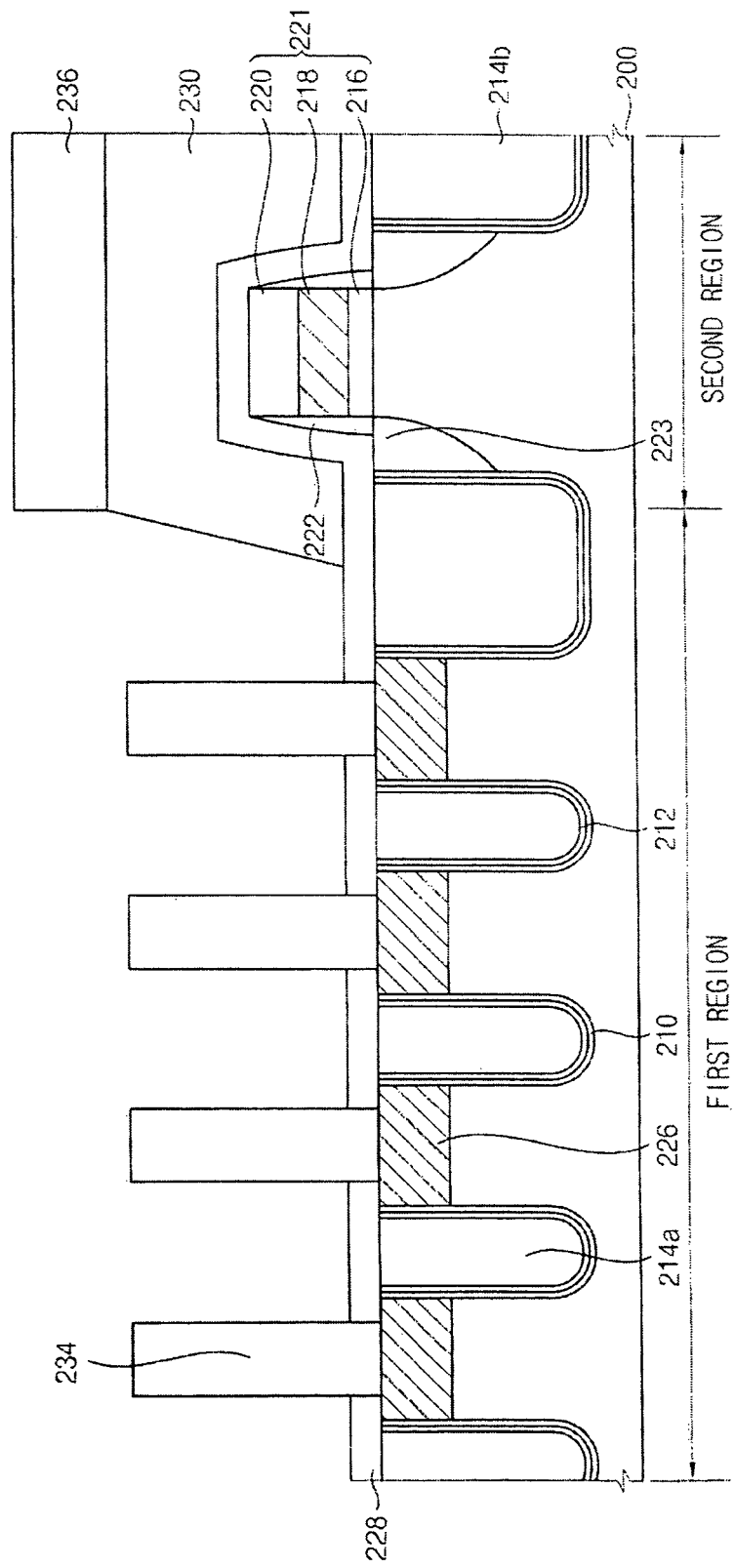

Referring to FIG. 29, a fifth photoresist pattern 236 may be formed on the second insulating interlayer 230 in the second region.

The second insulating interlayer 230 may be etched using the fifth photoresist pattern 236 as an etching mask so as to expose the etch stop layer 228. The etching process may include, e.g., a dry etching process or a wet etching process. The fifth photoresist pattern 236 may be removed by, e.g., an ashing process and/or a stripping process.

Figure 30:
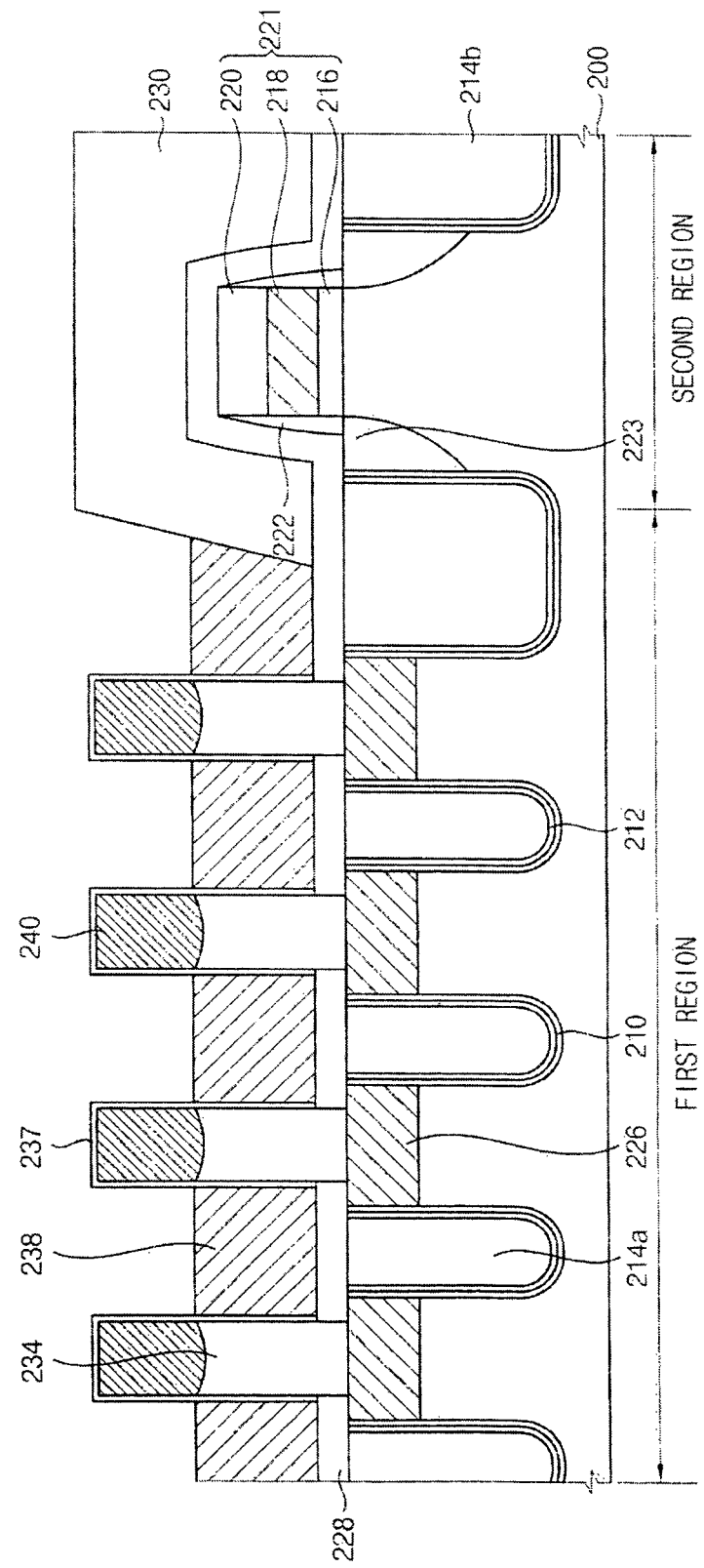

Referring to FIG. 30, a first gate insulation layer 237 may be formed on a surface of the pillars 234. The first gate insulation layer 237 may be formed by, e.g., thermally oxidizing the surface of the pillars 234. In an alternative implementation, the first gate insulation layer 237 may be formed by, e.g., depositing silicon oxide on the surface of the pillars 234.

A first gate electrode 238 may be formed on the first gate insulation layer 237 and the etch stop layer 228. The first gate electrode 238 may be formed by processes substantially the same as those illustrated with reference to FIGS. 13 to 15.

The first gate electrode 238 may be electrically insulated from the substrate 200 by the etch stop layer 228.

Impurities may be implanted into upper portions of the pillars 234 to form first impurity regions 240 serving as source/drain regions.

Figure 31:
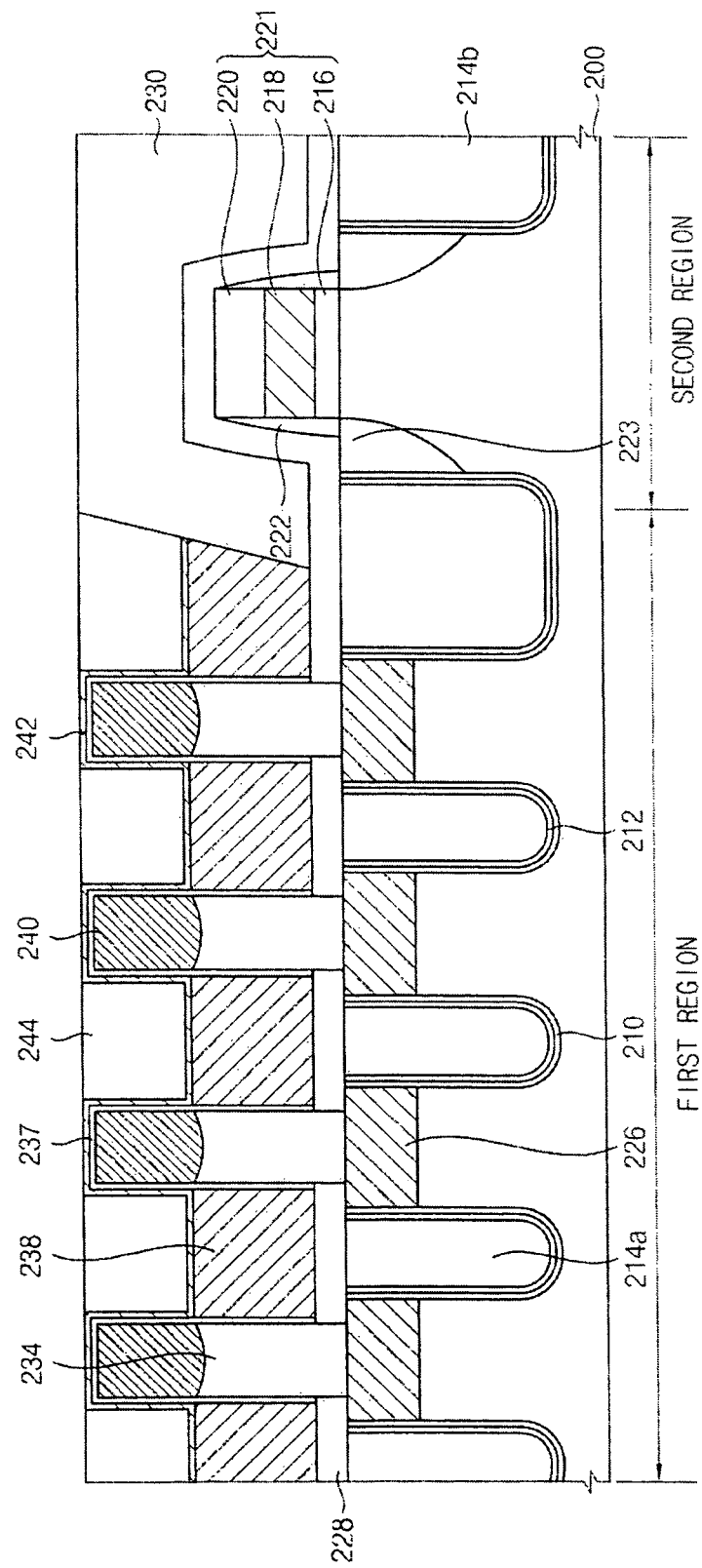

Referring to FIG. 31, a second liner 242 may be formed on the first gate electrode 238 and the first gate insulation layer 237. The second liner 242 may be formed from, e.g., silicon nitride. A first insulating interlayer 244 may be formed on the second liner 242 to fill spaces between the pillars 234. An upper portion of the first insulating interlayer 244 may be planarized until portions of the second liner 242 over top surfaces of the pillars 234 are exposed.

Referring to FIGS. 20 and 21, a third insulating interlayer 246 may be formed on the first and second insulating interlayers 244 and 230.

A first contact plug 247a may be formed through the first and third insulating interlayers 244 and 246. A second contact plug 247b may be formed through the second and third insulating interlayers 230 and 246, the etch stop layer 228, and the mask 220. A first wiring 248a may be formed on the third insulating interlayer 246 so as to be electrically connected to the first contact plug 248a. A second wiring 248b may be formed on the third insulating interlayer 246 so as to be electrically connected to the second contact plug 248b. Other wirings (not illustrated) may be further formed on the third insulating interlayer 246 so as to be electrically connected to the second source/drain region 223.

Capacitors 250 including a lower electrode 250a, a dielectric layer 250b, and an upper electrode 250c may be formed on the first insulating interlayer 244 so as to be electrically connected to the pillars 234.

As illustrated above, the semiconductor device having the vertical channel transistors and the planar transistor may be easily and efficiently manufactured.

Figure 32:
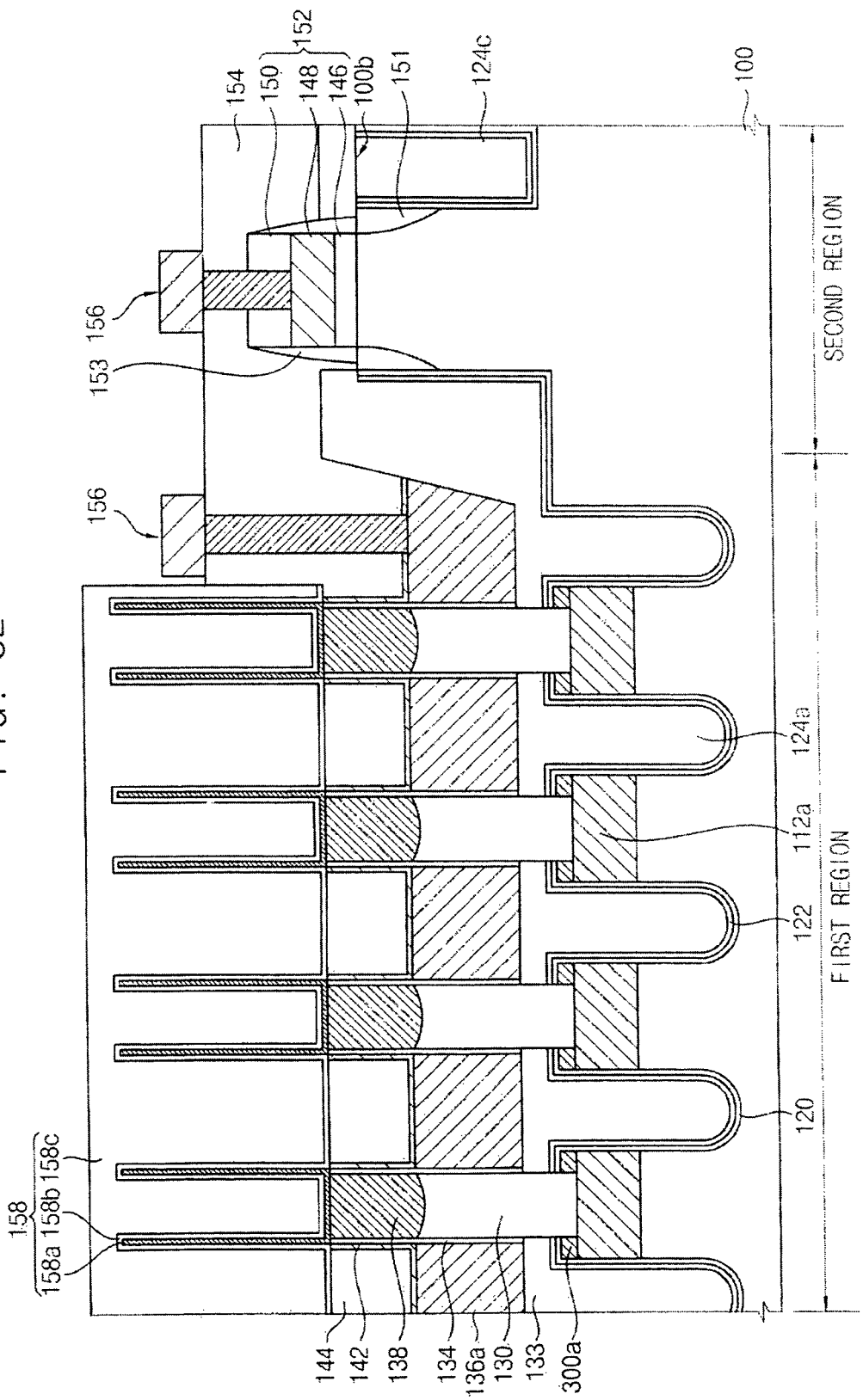
FIG. 32 illustrates a cross-sectional view of a semiconductor device according to yet another embodiment.
Figure 33:
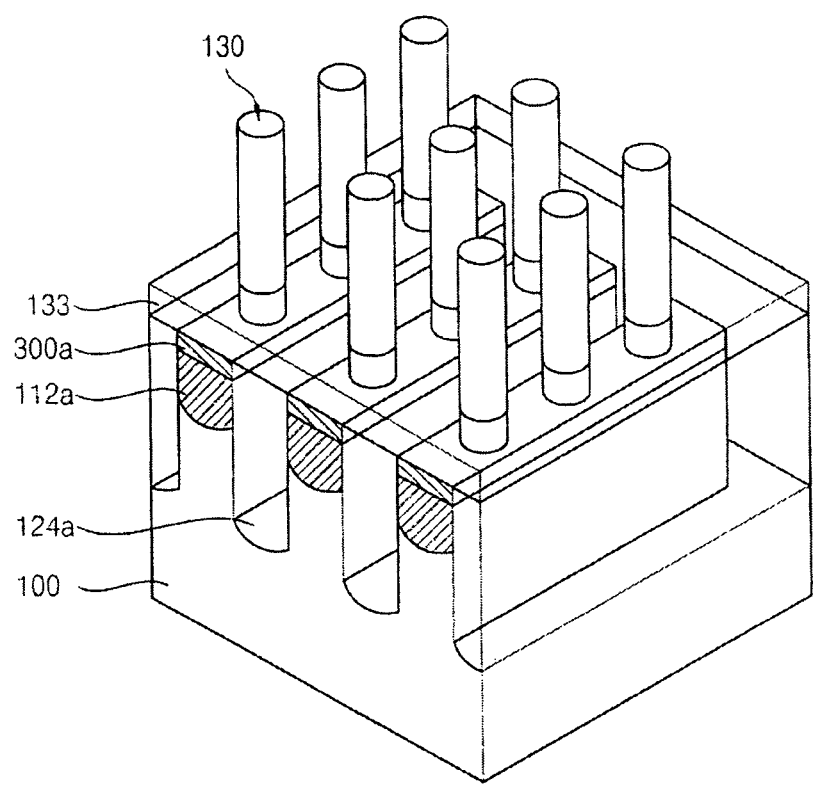
FIG. 33 illustrates a perspective view of pillars and bit lines of the semiconductor device in FIG. 32.

FIG. 32 illustrates a cross-sectional view of a semiconductor device according to yet another embodiment. FIG. 33 illustrates a perspective view of pillars and bit lines of the semiconductor device in FIG. 32.

The semiconductor device in FIG. 32 may be substantially the same as the semiconductor device of FIG. 2 except that the bit line may have a stacked structure including a conductive pattern and an impurity region. Thus, like numerals refer to like elements, and repeated explanations are omitted here.

Referring to FIGS. 32 and 33, the semiconductor device may include a conductive pattern 300a at an upper portion of each first active region of the substrate 100.

The conductive pattern 300a may be electrically connected to the first impurity region 112a. The conductive pattern 300a may be formed from, e.g., a metal, a metal nitride, a metal silicide, and the like. The conductive pattern 300a may have, e.g., a single layer or a multi-layered structure. In an implementation, the metal silicide may include, e.g., cobalt silicide, titanium silicide, and the like.

The first impurity region 112a together with the conductive pattern 300a may serve as a bit line. The bit line may have a reduced resistance because of the conductive pattern 300a having a low resistance.

As illustrated in FIG. 32, a top surface of the substrate 100 in the first region may not have the same height as that of the second region. However, like the semiconductor device in FIG. 20, in an alternative implementation, the substrate 100 may have an even, i.e., coplanar, top surface throughout the first and second regions.

Figure 34:
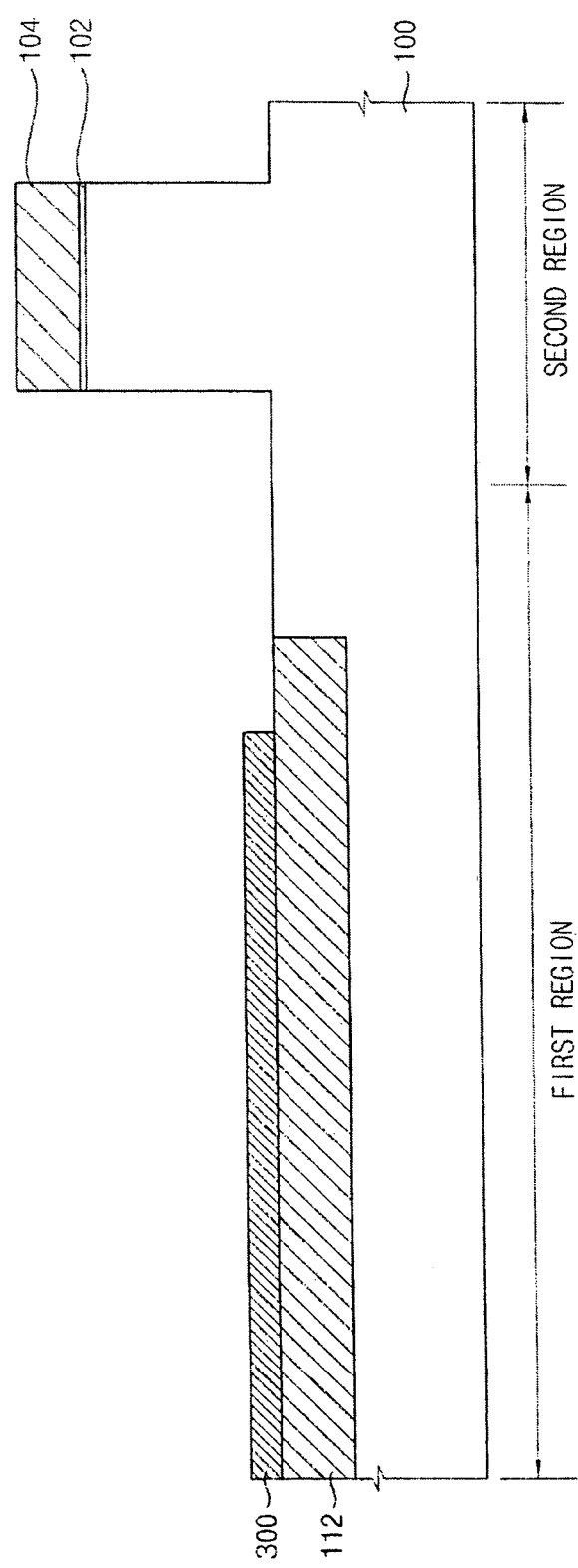
FIG. 34 illustrates a cross-sectional view of stages in a method of manufacturing the semiconductor device of FIGS. 32 and 33.

FIG. 34 illustrates a cross-sectional view of a stage in a method of manufacturing the semiconductor device of FIGS. 32 and 33. The method of manufacturing the semiconductor device of FIGS. 32 and 33 is substantially the same as the method illustrated in FIGS. 4 to 17, except for formation of the conductive pattern 300a. Thus, some figures among FIGS. 4 to 17 may be used for illustrating stages in the method of manufacturing the semiconductor device of the present embodiment.

Referring to FIG. 34, a conductive layer 300 may be formed on the substrate 100 in the first region in FIG. 5. The conductive layer 300 may be formed by, e.g., a deposition process and a heat treatment process.

In particular, a blocking layer pattern (not illustrated) may be formed on the substrate 100 in the second region. The blocking layer may be formed from, e.g., silicon nitride. A metal layer (not illustrated) may be formed on the substrate 100 and the blocking layer pattern. A heat treatment process may be performed on the substrate 100, so that the metal in the metal layer and the silicon in the substrate 100 may be reacted with other. Thus, the conductive layer 300 including, e.g., metal silicide, may be formed on the substrate 100. A portion of the metal layer that is not reacted with silicon and the blocking layer may be removed.

Processes substantially the same as those illustrated with reference to FIGS. 6 to 10 may then be performed. When the exposed portions of the first insulation layer pattern 124c and portions of the first liner 122 and the oxide layer 120 thereunder are removed, portions of the conductive layer 300 may be also removed, thereby forming a conductive pattern 300a.

Processes substantially the same as those illustrated with reference to FIGS. 11 to 19, 2, and 3 may be performed, so that the semiconductor device may be manufactured.

Figure 35:
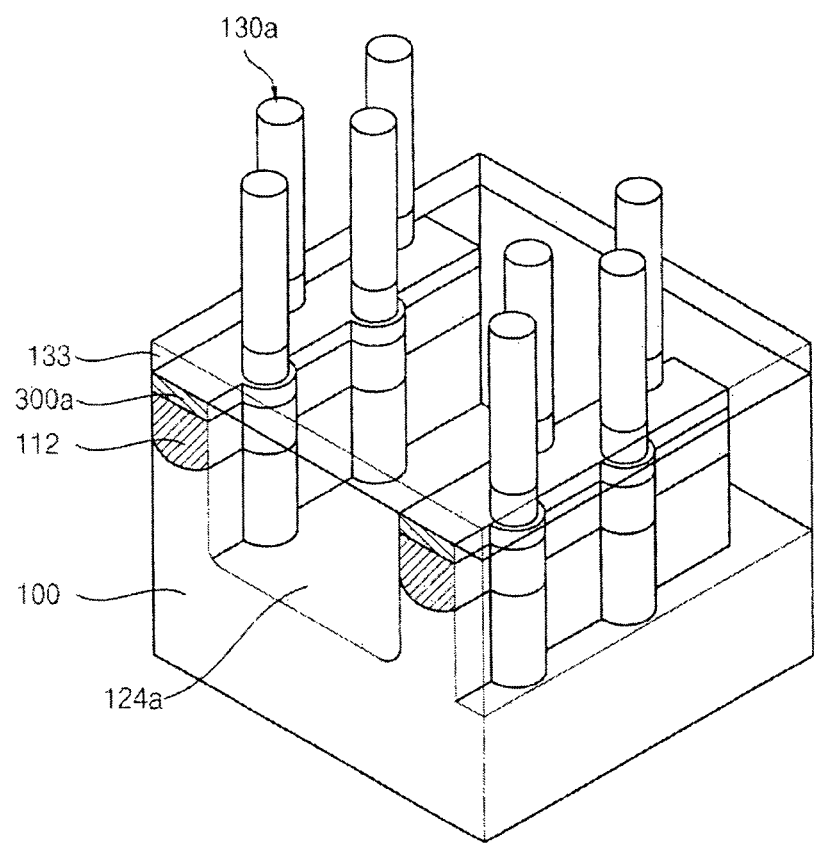
FIG. 35 illustrates a perspective view of pillars and bit lines of a semiconductor device according to still another embodiment.

FIG. 35 illustrates a perspective view of pillars and bit lines of a semiconductor device according to still another embodiment.

The semiconductor device in FIG. 35 is substantially the same as the device of FIG. 33 except for a location of the pillars and a shape of the first active region. Thus, like numerals refer to like elements, and repetitive explanations are omitted here.

Referring to FIG. 35, the first active region may extend in a first direction. The first active region may have a width in a second direction perpendicular to the first direction that may vary according to the position. That is, the first active region may have a first width at a first position where the pillars 130a are not formed and a second width, larger than the first width, at a second position where the pillars 130a are formed. At the second position, the first active region may protrude in the second direction.

As illustrated in FIG. 35, the pillars 130a may be disposed in a zigzag style, i.e., one pillar 130a may be formed along the second direction at a specific portion of the first active region. In an alternative implementation, two pillars 130a may be formed along the second direction at a specific portion of the first active region.

The first active region may have a width larger than a width of the pillars 130a. Thus, the semiconductor device may include a sufficient conductive pattern 300a to thereby reduce resistance of the bit line.

The semiconductor device illustrated in FIG. 35 may be manufactured by a method substantially the same as that illustrated with reference to. FIG. 34. However, the location of the pillars 130a and the shape of the first active region are different from those of the semiconductor device of FIG. 33, and thus an etching mask pattern for forming the first active region and the pillars 130a may be different.

According to an embodiment, a vertical channel transistor and a planar transistor may be easily formed on the same substrate.

According to an embodiment, the pillar may be formed by, e.g., an epitaxial growth process, and thus the pillar having a desired size may be easily formed.

Additionally, the bit line may be formed before forming the pillar, thereby being easily formed. Furthermore, the isolation layer patterns may be formed before forming the pillar, thereby being easily formed. Thus, the semiconductor device having the vertical channel transistor including the pillar may have good electrical characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device, the method comprising:
   providing a substrate, the substrate including single crystalline silicon and having a first region and a second region;
   etching the substrate in the first region such that a top surface of the substrate in the first region is lower than a top surface of the substrate in the second region;
   growing a pillar from the top surface of the substrate in the first region thereof after etching the substrate;
   forming a vertical channel transistor including a first gate structure such that first gate structure surrounds a central portion of the pillar; and
   forming a second transistor on the substrate in the second region thereof such that the second transistor includes a second gate structure.

2. The method as claimed in claim 1, wherein the pillar has a top surface coplanar with or higher than a top surface of the substrate in the second region.

3. The method as claimed in claim 1, further comprising forming isolation layer patterns in upper portions of the substrate in the first and second regions.

4. The method as claimed in claim 3, wherein forming the isolation layer patterns occurs prior to forming the pillar.

5. The method as claimed in claim 1, wherein growing the pillar includes performing a laser epitaxial growth (LEG) process or a selective epitaxial growth (SEG) process.

6. The method as claimed in claim 5 wherein growing the pillar includes the SEG process, the SEG process including:
   forming an insulation layer pattern on the substrate in the first region thereof;
   partially removing portions of the insulation layer pattern so as to form an opening exposing a top surface of the substrate in the first region; and
   growing the pillar from the top surface of the substrate.

7. The method as claimed in claim 5, wherein growing the pillar includes the LEG process, the LEG process including:
   forming an insulation layer pattern on the substrate in the first region thereof;
   partially removing portions of the insulation layer pattern to form an opening exposing a top surface of the substrate in the first region;
   forming an amorphous silicon layer in the opening; and
   performing a heat treatment on the amorphous silicon layer to convert the amorphous silicon layer into the pillar including single crystalline silicon.

8. The method as claimed in claim 1, further comprising forming a bit line by implanting impurities into an upper portion of the substrate.

9. The method as claimed in claim 8, wherein forming the bit line occurs prior to growing the pillar.

10. The method as claimed in claim 1, further comprising forming a capacitor such that the capacitor is electrically connected to the pillar.

11. The method as claimed in claim 1, further comprising forming an impurity region by implanting impurities into an upper portion of the pillar.

12. The method as claimed in claim 1, wherein the second transistor includes a planar transistor.

* * * * *